United States Patent
Shimura et al.

(10) Patent No.: US 7,477,538 B2
(45) Date of Patent: Jan. 13, 2009

(54) MAGNETIC RANDOM ACCESS MEMORY

(75) Inventors: Kenichi Shimura, Tokyo (JP); Kuniko Kikuta, Tokyo (JP)

(73) Assignee: NEC Corporation, Tokyo (JP)

( * ) Notice: Subject to any disclaimer, the term of this patent is extended or adjusted under 35 U.S.C. 154(b) by 262 days.

(21) Appl. No.: 10/561,213

(22) PCT Filed: Jun. 16, 2004

(86) PCT No.: PCT/JP2004/008462

§ 371 (c)(1),
(2), (4) Date: Jan. 9, 2006

(87) PCT Pub. No.: WO2004/114409

PCT Pub. Date: Dec. 29, 2004

(65) Prior Publication Data

US 2006/0132987 A1    Jun. 22, 2006

(30) Foreign Application Priority Data

Jun. 20, 2003    (JP) .............................. 2003-176699

(51) Int. Cl.
*G11C 11/00*    (2006.01)
(52) U.S. Cl. .................. 365/158; 365/53; 365/171; 365/173
(58) Field of Classification Search ............... 365/158, 365/171, 173, 53, 66
See application file for complete search history.

(56) References Cited

U.S. PATENT DOCUMENTS

| | | | |
|---|---|---|---|
| 5,659,499 A * | 8/1997 | Chen et al. .................. | 365/158 |
| 6,211,090 B1 | 4/2001 | Durlam et al. | |
| 6,510,078 B2 * | 1/2003 | Schwarzl ..................... | 365/158 |
| 6,556,473 B2 * | 4/2003 | Saito et al. .................. | 365/158 |
| 6,567,299 B2 * | 5/2003 | Kunikiyo et al. ............ | 365/173 |
| 6,590,803 B2 * | 7/2003 | Saito et al. .................. | 365/158 |

(Continued)

FOREIGN PATENT DOCUMENTS

JP    2001273759 A  * 10/2001

(Continued)

OTHER PUBLICATIONS

Durlam et al. "A low power 1Mbit MRAM based on 1T1MTJ bit cell integrated with Copper Interconnects" 2002 Symposium on VLSI Circuits Digest of Technical Papers. pp. 158-161.*

*Primary Examiner*—Anh Phung
*Assistant Examiner*—Alexander Sofocleous
(74) *Attorney, Agent, or Firm*—Sughrue Mion, PLLC

(57) ABSTRACT

A technique for reducing influences of the bias magnetic field developed by yokes used for concentrating the magnetic field on magnetoresistance elements, on MRAM operations. An MRAM is composed of a plurality of magnetoresistance elements having magnetic anisotropy in a first direction; a wiring extended in a second direction different from the first direction, through which a write current flows for writing data into the magnetoresistance elements; and a yoke layer formed of ferromagnetic material, extended along the second direction, and covering at least a portion of a surface of the wiring. The plurality of magnetoresistance elements include a first magnetoresistance element, and a second magnetoresistance element of which the distance from an end of the yoke layer is further than that of the first magnetoresistance element. The first magnetoresistance element has a magnetic anisotropy stronger than that of the second magnetoresistance element.

13 Claims, 30 Drawing Sheets

U.S. PATENT DOCUMENTS

| | | | |
|---|---|---|---|
| 6,661,071 B2 * | 12/2003 | Lenssen et al. | 257/422 |
| 6,717,845 B2 * | 4/2004 | Saito et al. | 365/173 |
| 6,812,538 B2 * | 11/2004 | Tsang | 257/421 |
| 6,927,468 B2 * | 8/2005 | Yoda et al. | 257/422 |
| 2003/0111626 A1 | 6/2003 | Hosotani | |

FOREIGN PATENT DOCUMENTS

| | | | |
|---|---|---|---|
| JP | 2002110938 A * | 4/2002 | |
| JP | 2002280526 A * | 9/2002 | |
| JP | 2002-299574 A | 10/2002 | |
| JP | 2002289807 A * | 10/2002 | |
| JP | 2003209226 A * | 7/2003 | |
| JP | 2004179192 A * | 6/2004 | |

* cited by examiner 55c, 55d, 56c, 56d: MAGNETIC FILM

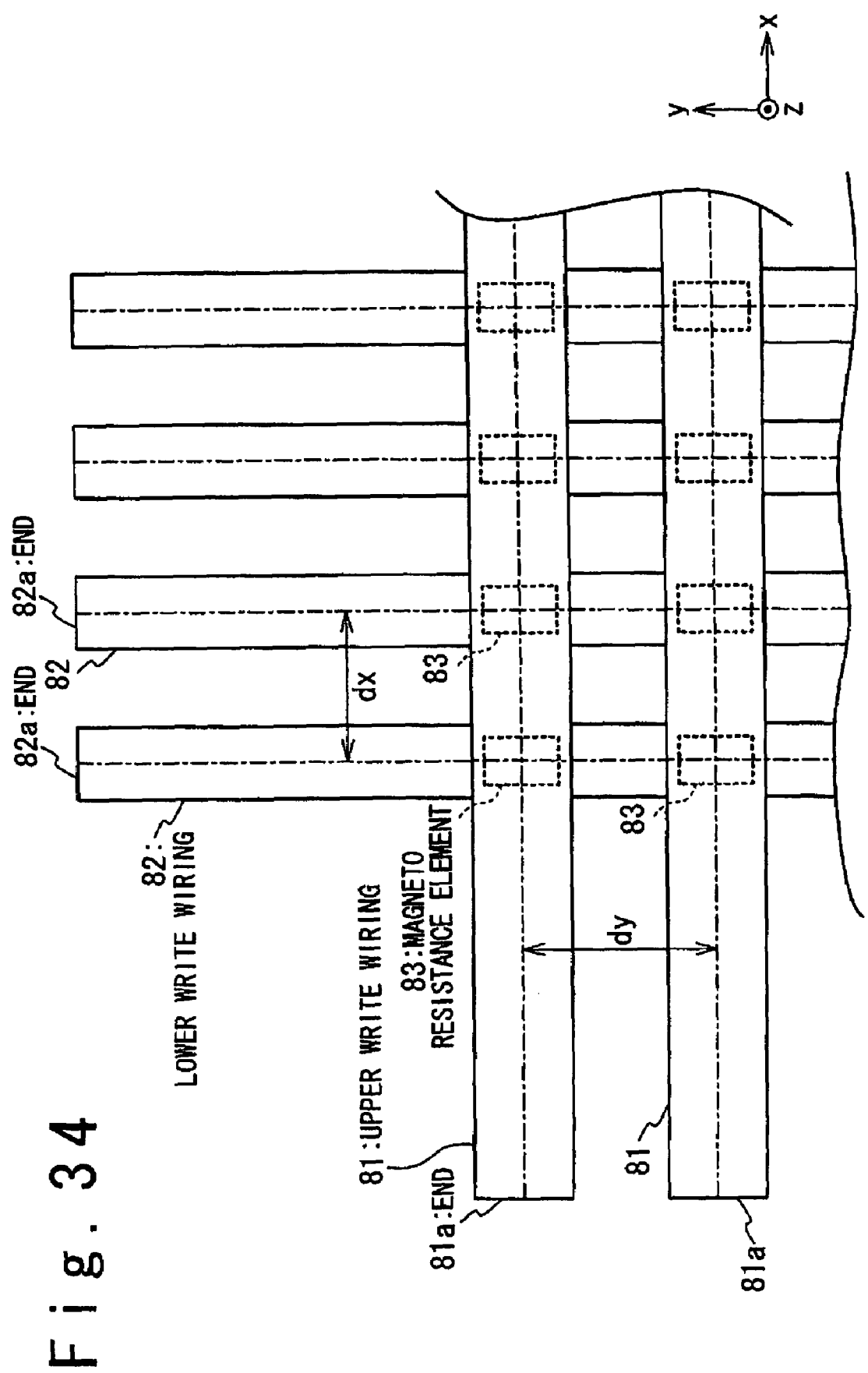

MAGNETIC RANDOM ACCESS MEMORY

TECHNICAL FIELD

The present invention relates to magnetic random access memories (referred to as MRAMs, hereinafter). In particular, the present invention relates to MRAMs in which write currents are flown through wirings provided with yokes.

BACKGROUND ART

The MRAM is a promising non-volatile memory that achieves high-speed write operation and an increased number of rewrite operations. A typical MRAM includes a memory cell array within which a plurality of magnetoresistance elements, which function as memory cells, are arranged in rows and columns. The magnetoresistance element is composed of a fixed ferromagnetic layer having a fixed spontaneous magnetization, and a free ferromagnetic layer having a reversible spontaneous magnetization (simply referred to as magnetization, hereinafter), and a spacer layer disposed between the fixed and free ferromagnetic layers. The free ferromagnetic layer is formed to allow the magnetization to be directed parallel or antiparallel to the magnetization of the fixed ferromagnetic layer.

Such designed magnetoresistance element stores one-bit data as the relative direction of the magnetizations of the fixed and free ferromagnetic layers. The magnetoresistance element is allowed to be placed into a "parallel" state in which the magnetizations of the fixed and free ferromagnetic layers are parallel, or an "antiparallel" state in which the magnetizations of the fixed and free ferromagnetic layers are parallel are antiparallel. The magnetoresistance element stores one-bit data, allocating one of the parallel and antiparallel states to logic "0", and the other to logic "1".

Write operation into a magnetoresistance element is achieved through developing a magnetic field by flowing a write current through a wiring disposed near the magnetoresistance element, and redirecting the magnetization of the free ferromagnetic layer with the developed magnetic field. The direction of the current is selected in accordance with the desired direction of the magnetization of the free ferromagnetic layer.

In order to reduce the consumption current of a MRAM, it is desired to reduce the current to reverse the magnetization of the free ferromagnetic layer (that is, the write current). One technique for reducing the write current is to provide a yoke layer of ferromagnetic material around the wiring through which the write current is developed. The yoke concentrates the magnetic field on the MRAM memory cell, and thereby effectively reduces the write current. Yoke-including MRAMs are disclosed in Japanese Laid Open Patent Application No. Jp-A 2002-110938, U.S. Pat. No. 6,211,090, and Japanese Laid Open Patent Applications Nos. Jp-A 2002-522915, and Jp-A-Heisei 9-204770.

On the other hand, the yoke, which effectively reduces the write current, may be a potential source of an undesirable bias magnetic field due to the shape anisotropy. The bias magnetic field designates the magnetic field applied to the magnetoresistance element with no write current developed.

FIGS. 35A and 35B illustrate a typical structure of an MRAM. As shown in FIG. 35A, wirings 101, through which write currents flow, are disposed to extend in the x-axis direction, and wirings 102 are disposed to extend in the y-axis. As shown in FIG. 35B, yokes 104 are formed to cover top and side surfaces of the wirings 101, with the ends thereof aligned to the ends of the wirings 101.

The yokes 104 are formed to be shaped correspondingly to the shapes of the wirings 101, to therefore extend along the direction in which the wirings 101 are extended. Such shape anisotropy of the yokes 102 helps the magnetizations of the yokes 104 to be directed along the direction in which the wirings 101 are extended. The reduction in the widths of the wirings 101 enhances the shape anisotropy of the yokes 104, and helps the magnetizations of the yokes 104 to be directed along the direction in which the wirings 101 are extended.

Directing the magnetizations of the yokes 104 along the direction in which the wirings 101 are extended results in that magnetic poles are developed on the ends 104a of the yokes 104 in the x-axis direction. These magnetic poles develop bias magnetic fields along the direction in which the wirings 101 are extended. Let us consider the case where a wiring 101 has a length of 100 µm, a width of 1 µm, and a thickness of 0.3 µm, and a yoke 104 formed of NiFe has a thickness of 50 nm. In this case, the bias magnetic field developed by the magnetic poles on the ends 104 of the yoke 104, and emitted from the ends 104, has an intensity of 10 (Oe) in the x-axis direction at a position where the distance from the end of the wiring 101 along the x-axis is 10 µm, and the distance from the bottom surface of the wiring 101 is 0.1 µm.

The bias magnetic field developed by the yokes exerts various influences on the operations of the MRAMs. Firstly, the bias magnetic field causes variations of the characteristics of the magnetoresistance elements, because the intensity of the bias magnetic field developed by the yokes depends on the positions within the memory cell array. This undesirably reduces the margin of the write currents.

Additionally, the bias magnetic field developed by the yokes reduces the coercive field of the free ferromagnetic layers within the magnetoresistance elements, and thereby enhances the magnetization flipping caused by thermal disturbance, when the direction of the magnetic anisotropy of the magnetoresistance elements are directed orthogonally to the direction of the bias magnetic field developed by the yokes. The generation of the bias magnetic field by the yokes is undesirable, because it deteriorates the data retention reliability of the MRAM.

Japanese Laid Open Patent Application Nos. Jp-A 2002-299574, JP-A 2002-280526, and JP-A 2001-273759 disclose MRAM structures for avoiding magnetic crosstalk; however, the disclosed structures does not addresses dealing with the generation of the bias magnetic field by the yokes.

DISCLOSURE OF THE INVENTION

One object of the present invention is to provide a technique for reducing influences of the bias magnetic field on MRAM operations, the influences being caused by the magnetic anisotropy of yokes provided for wirings to concentrate the magnetic field on magnetoresistance elements.

Another object of the present invention is to provide a technique for preventing the bias magnetic field developed by yokes provided for wirings to concentrate the magnetic field on magnetoresistance elements from being applied to the magnetoresistance elements.

In one aspect, an MRAM according to the present invention is composed of a plurality of magnetoresistance elements having magnetic anisotropy in a first direction; a wiring extended in a second direction different from the first direction, through which a write current is flown for writing data into the magnetoresistance elements; and a yoke layer covering at least a portion of a surface of the wiring. The yoke layer is formed of ferromagnetic material, and extended along the second direction. The plurality of magnetoresistance elements include a first magnetoresistance element, and a second magnetoresistance element of which the distance from an end of the yoke layer is further than that of the first magnetoresistance element. The first magnetoresistance element, positioned closer to the end of the yoke layer, has a magnetic anisotropy stronger than that of the second magnetoresistance element, positioned further from the end of the yoke layer. The stronger magnetic anisotropy of the first magnetoresistance element, positioned closer to the end of the yoke layer, compensates for the reduction in the coercive field caused by the bias magnetic field developed by the yoke layer in the second direction, and thereby effectively avoids the magnetization flipping of the first magnetoresistance element caused by thermal disturbance.

Adjustment of the magnetic anisotropy may be achieved by, for example, the shape of the first magnetoresistance element. Specifically, the first and first magnetoresistance elements may be designed so that a first aspect ratio defined as a ratio of a length of the first magnetoresistance element in the first direction to a width of the first magnetoresistance element in the second direction is larger than a second aspect ratio defined as a ratio of a length of the second magnetoresistance element in the first direction to a width of the second magnetoresistance element in the second direction.

In another aspect, a magnetic random access memory according to the present invention is composed of a magnetoresistance element; a first wiring through which a write current is flown for writing data into the magnetoresistance element; a first yoke layer covering at least portion of a surface of the wiring; and a magnetic field control structure introducing a magnetic field developed by magnetic poles appearing at ends of the first yoke layer in the first direction away from the magnetoresistance element. The first yoke layer is formed of ferromagnetic material, extended in the first direction. The field control structure, which introduces the bias magnetic field developed by the first yoke layer away from the magnetoresistance element, effectively reduces the bias magnetic field applied to the magnetoresistance element. Therefore, the field control structure reduces influences of the bias magnetic field developed by the first yoke layer on the characteristics of the magnetoresistance element.

More specifically, the magnetic field control structure preferably includes a magnetic shielding structure positioned between the ends of the first yoke layer and the magnetoresistance element. Preferably, the magnetic shielding structure obliquely intersects the first wiring. The obliquely-intersecting magnetic shielding structure introduces much of the bias magnetic field into the inside thereof, and effectively reduces the bias magnetic field crossing the magnetoresistance elements.

In order to make the fabrication process of the MRAM easier, it is preferable that the magnetic shielding structure has a same stack structure as at least a portion of the magnetoresistance element.

Preferably, the magnetic random access memory further includes: a second wiring which is not used for writing data into any magnetoresistance elements within the magnetic random access memory; the second wiring being provided to extend in a direction different from the first direction and positioned between the end of the yoke layer and the magnetoresistance element; and a second yoke layer covering at least a portion of a surface of the second wiring. The second yoke layer functions as the magnetic shielding structure. The second wiring and the second yoke layer can be formed in the same process as the existing wirings and yoke layers. Such structure effectively makes the fabrication process of the MRAM easy.

When the MRAM further includes a spacer layer covering the first yoke layer, it is preferable that the magnetic field control structure includes a magnetic layer covering the spacer layer, and the magnetic layer introduces a magnetic field emitted from one of the ends of the first yoke layer into another of the ends of the first yoke layer. Such structure allows the yoke layer and the magnetic layer to function as a closed magnetic path, and effectively prevents the bias magnetic field emitted form the end of the yoke layer from crossing the magnetoresistance element.

In order to achieve this, magnetizations of the first yoke layer and the magnetic layer are preferably directed in opposite directions. Furthermore, the spacer layer is formed so as to antiferromagnetically couple the first yoke layer with the magnetic layer, more preferably by antiferromagnetic exchange coupling.

When the magnetic random access memory further includes a second interconnection provided to extend in the first direction; and a second yoke layer formed of ferromagnetic material, extended in the first direction, and covering at least portion of a surface of the second wiring, the magnetic field control structure preferably includes a magnetic member magnetically connecting the first and second yoke layers.

For example, when the second wiring is adjacent to the first wiring in a second direction orthogonal to the first direction, the magnetic member preferably includes: a first magnetic member magnetically connecting one end of the first yoke layer with one end of the second yoke layer; and a second magnetic member magnetically connecting another end of the first yoke layer with another end of the second yoke layer. Such structure allows the first and second layers, and the first and second magnetic members to provide a closed magnetic path, circulating the bias magnetic field, and effectively prevents the bias magnetic field which the first and second yoke layers emit from the ends in the first direction from crossing the magnetoresistance element.

It should not be understood that the number of the first and second wirings are each one. It should be interpreted that yoke layers covering three or more wirings may be magnetically connected with the first and second magnetic member.

In this case, it is preferable that the magnetic random access memory further includes a third magnetic member disposed between the first and second magnetic members; a fourth magnetic member positioned on an opposite side of the magnetoresistance element with respect to the third magnetic member, disposed between the first and second magnetic members. The third and fourth magnetic members enhance the circulation of the bias magnetic field developed by the first and second yoke layers, and effectively prevent the bias magnetic field from crossing the magnetoresistance element.

Moreover, such arrangement may be applicable to a case where the second wiring is adjacent to the first wiring in the first direction.

When the magnetic random access memory further includes: a second wiring provided to extend in the first direction, and adjoining the first wiring in the first direction; and a second yoke layer formed of ferromagnetic material, extended in the first direction, and covering at least portion of a surface of the second wiring, the second yoke layer may function as the magnetic field control structure, arranged close to the first yoke layer so that the second yoke layer is magnetically connected with the first yoke layer.

In another aspect of the present invention, a magnetic random access memory is composed of a magnetoresistance element; a wiring through which a write current is flown for writing data into the magnetoresistance element; and a yoke layer formed of ferromagnetic material, extended in a direction in which the wiring is extended, and covering at least portion of a surface of the second wiring. An end of the yoke layer is positioned sufficiently far away so that a magnetic field emitted from the end exerts substantially no effect on characteristics of the magnetoresistance element.

Quantitatively, an end of the yoke layer is preferably positioned away from a nearest magnetoresistance element so that an intensity of a magnetic field which a magnetic pole appears at the end applies to the nearest magnetoresistance element is reduced down to or less of one-fifth of an intrinsic coercive field of free ferromagnetic layers within the magnetoresistance elements, where the nearest magnetoresistance element is defined as one of the magnetoresistance elements closest to the end. The intrinsic coercive field of the free magnetic layers within the magnetoresistance elements means the coercive field in the case where no magnetic field is applied to the free ferromagnetic layers orthogonally to the magnetizations thereof. The magnetic field applied to the magnetoresistance element by the magnetic poles appearing at the end of the yoke layer is decreased by increasing the distance from the end of the yoke layer to the nearest magnetoresistance element.

In still another aspect of the present invention, a magnetic random access memory is composed of a plurality of first wirings extending in a first direction; a plurality of second wirings disposed to extend in a second direction different from the first direction; first yoke layers covering at least portions of the respective first wirings; and magnetoresistance elements arranged at respective intersections of the first and second wirings. First ends of the first yoke layers in the first direction are positioned away from nearest magnetoresistance elements so that distances from the nearest magnetoresistance elements to the first ends are equal to or more than a minimum pitch of the second wirings, the nearest magnetoresistance elements being ones of the magnetoresistance elements positioned nearest to the first ends. The magnetic field applied to the magnetoresistance element by the magnetic poles appearing at the end of the first yoke layer is decreased by increasing the distance from the end of the first yoke layer to the nearest magnetoresistance element.

When the MRAM further includes second yoke layers covering at least portions of the respective second wirings, second ends of the second yoke layers in the second direction are positioned away from nearest magnetoresistance elements so that distances from the nearest magnetoresistance elements to the second ends are equal to or more than a minimum pitch of the first wirings, the nearest magnetoresistance elements being ones of the magnetoresistance elements positioned nearest to the first ends. The magnetic field applied to the magnetoresistance element by the magnetic poles appearing at the end of the second yoke layer is decreased by increasing the distance from the end of the second yoke layer to the nearest magnetoresistance element.

As thus described, the present invention can provide a technique for reducing influences of the bias magnetic field developed by yokes used for concentrating the magnetic field on magnetoresistance elements, on MRAM operations.

BRIEF DESCRIPTION OF THE DRAWINGS

FIG. 34 is a plan view illustrating an MRAM in a sixth embodiment of the present invention;

BEST MODE FOR CARRYING OUT THE INVENTION

With reference to the attached drawings, description is made below of embodiments of the MRAM according to the present invention.

First Embodiment

Figure 1:
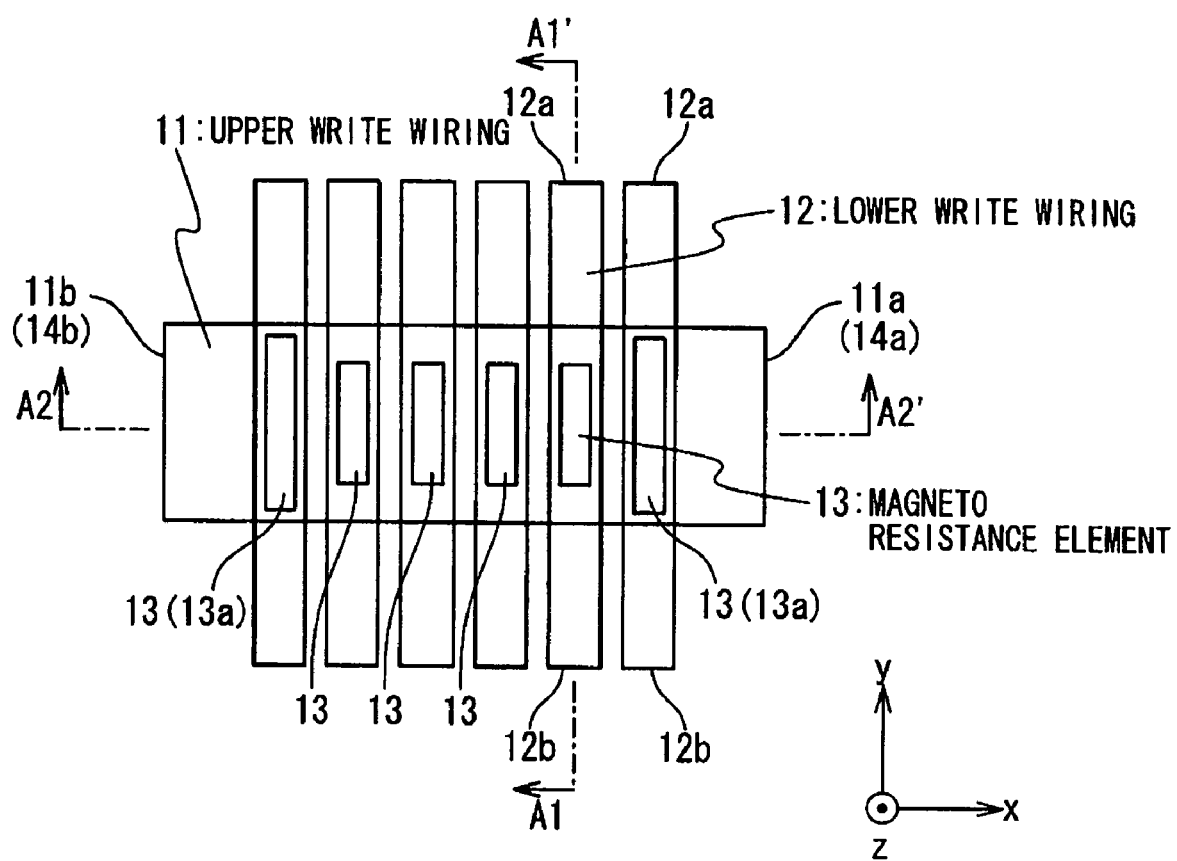
FIG. 1 is a top view illustrating a first embodiment of an MRAM according to the present invention.
Figure 2:
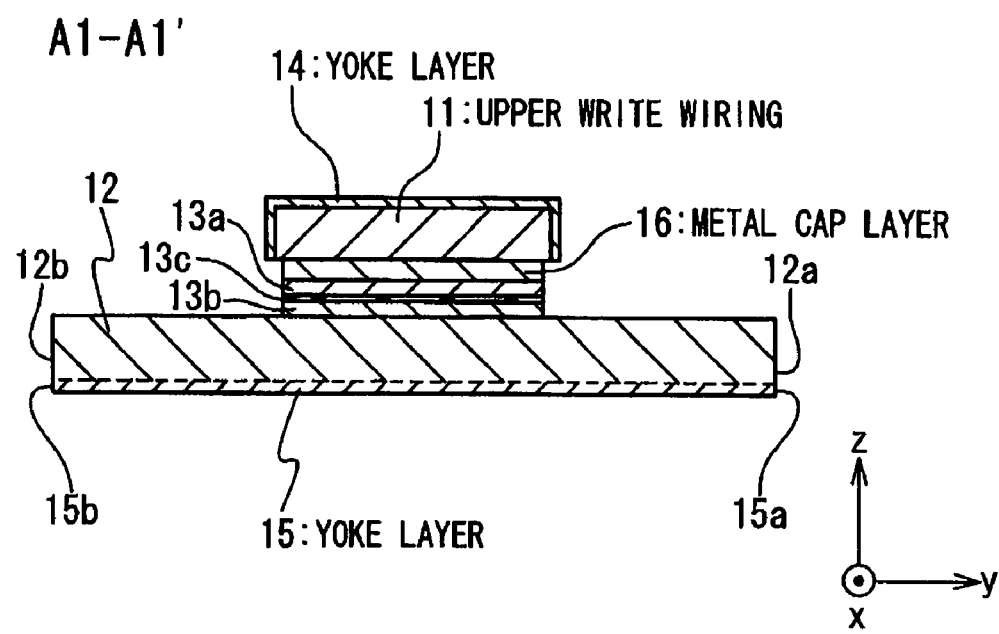
FIG. 2 is a section view illustrating the first embodiment of the MRAM according to the present invention.

In a first embodiment, as shown in FIG. 1, upper write wirings 11 are disposed to extend in the x-axis direction, and lower write wirings 12 are disposed to extend in the y-axis direction, which is orthogonal to the x-axis direction. Magnetoresistance elements 13 are disposed at respective intersections of the upper and lower write wirings 11 and 12. As shown in FIG. 2, the magnetoresistance elements 13 each include a free ferromagnetic layer 13a, a fixed ferromagnetic layer 13b, and a spacer layer 13c disposed therebetween. The free ferromagnetic layers 13a are connected to the upper write wirings 11 through metal cap layers 16. The fixed ferromagnetic layers 13b are formed on the lower write wirings 12, and electrically connected to the lower write wirings 12. Each magnetoresistance element 13 stores one-bit data as the direction of the magnetization of the free ferromagnetic layer 13a. The magnetoresistance elements 13 are formed to be long along the y-axis direction with the magnetic anisotropy of the magnetoresistance elements 13 directed in parallel to the y-axis direction.

Figure 3:
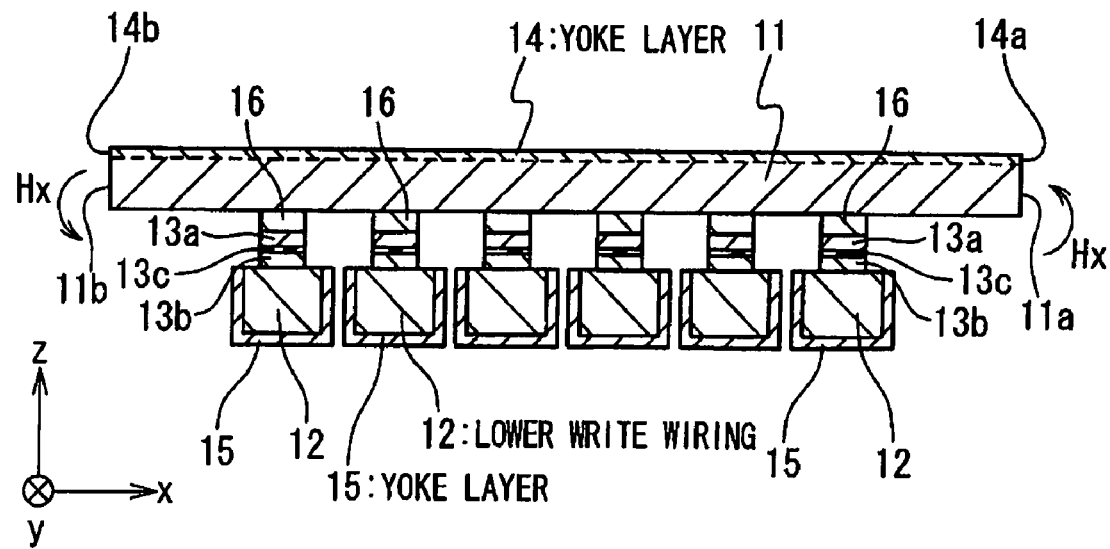
FIG. 3 is a section view illustrating the first embodiment of the MRAM according to the present invention.
Figure 12:
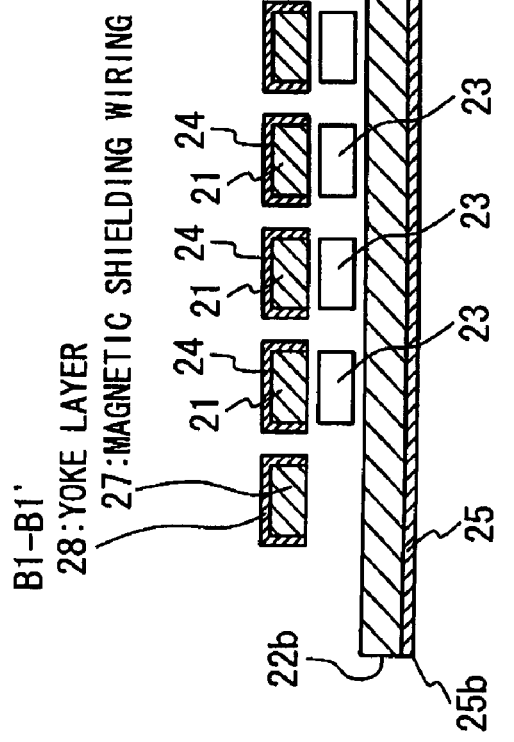
FIG. 12 is a section view illustrating still another modification of the MRAM of the second embodiment.

As shown in FIG. 2, top and side surfaces of the upper write wirings 11 are covered with yoke layers 14, and as shown in FIG. 12, bottom and side surfaces of the lower write wirings 12 are covered with yoke layers 15. The yoke layers 14 and 15 are both formed of magnetically-soft ferromagnetic material. As shown in FIG. 3, the yoke layers 14 are formed so that the ends 14a and 14b thereof in the x-axis direction are aligned with the ends 11a and 11b of the upper write wirings 11, respectively. Additionally, as shown in FIG. 2, the yoke layers 15 are formed so that the ends 15a and 15b thereof in the y-axis direction are aligned with the ends 12a and 12b of the lower write wirings 12, respectively. Therefore, the yoke layers 14 are shaped to be long along the x-axis direction, and the yoke layers 15 are shaped to be long along the y-axis direction.

As shown in FIG. 3, the yoke layers 14 develop a bias magnetic field Hx in the x-axis direction due to the shape anisotropy thereof. Due to the shape anisotropy of the yoke layers, which are long along the x-axis direction, the magnetizations of the yoke layers 14 are directed in the x-axis direction. These magnetizations develop magnetic poles on the ends 14a and 14b of the yoke layers 14, and the magnetic poles develops the bias magnetic field in the x-axis direction.

The magnetic field emitted in the x-axis direction from the magnetic poles on the ends 14a and 14b of the yoke layers 14 deteriorates tolerance to the thermal disturbance of the data stored in the magnetoresistance elements 13 positioned close to the ends 14a and 14b of the yoke layers 14. The strength of the bias magnetic field Hx applied to the respective magnetoresistance elements 13 is enhanced as the distance from the ends 14a and 14b of the yoke layers 14 decreases. Furthermore, the coercive magnetic field (reversing magnetic field) of a certain magnetoresistance element 13 decreases as the strength of the bias magnetic field Hx applied to the certain magnetoresistance element 13 is enhanced. Therefore, the coercive magnetic field of the magnetoresistance elements 13 are decreased as the distances from the ends 14a and 14b of the yoke layers 14 are decreased, and therefore the tolerance to the thermal disturbance of the magnetoresistance elements 13 are deteriorated.

In order to enhance the tolerance to the thermal disturbance of the magnetoresistance elements 13 positioned close to the ends 14a and 14b of the yoke layers 14, the magnetoresistance elements 13 positioned close to the ends 14a and 14b of the yoke layers 14 (that is the magnetoresistance elements 13 positioned close to the ends 11a and 11b of the upper write wirings 11) are given with stronger magnetic anisotropy compared with ones positioned away from the ends 14a and 14b of the yoke layers 14. Describing more mathematically, the magnetic anisotropy of a certain magnetoresistance element 13 is determined as being increased monotonically in the broad sense with respect to the inverse of the distances from one of the ends 14a and 14b of the yoke layer 14, the one being closer to the certain magnetoresistance element 13. Larger magnetic anisotropy of the magnetoresistance elements 13 positioned close to the ends 14a and 14b of the yoke layers 14 cancels the deterioration of the tolerance to the thermal disturbance of the magnetoresistance elements 13 due to the application of the strong bias magnetic field.

In order to provide the magnetoresistance elements 13 with stronger magnetic anisotropy as the distance from the ends 14a and 14b of the yoke layers 14 are decreased, as shown in FIG. 1, the magnetoresistance elements 13 positioned close to the ends 14a and 14b of the yoke layers 14 are shaped to be longer and thinner along the y-direction compared to the magnetoresistance elements 13 positioned away from the ends 14a and 14b of the yoke layers 14. In other words, the respective magnetoresistance elements 13 are shaped so that the aspect ratios R of the magnetoresistance elements 13 are monotonically increased in the broad sense with respect to the inverse of the distances d of the magnetoresistance elements 13 from closer one of the ends 14a and 14b of the yoke layers 14, wherein the aspect ratios R of the magnetoresistance elements 13 are defined by the following equation:

$R=L/w$, where w is the width of the magnetoresistance elements 13 in the y-axis direction, and L is the length in the x-axis direction. In FIG. 1, the magnetoresistance elements 13 closest to the ends 14a and 14b of the yoke layers 14 are shaped so that the aspect ratios R thereof are larger than those of the other magnetoresistance elements 13. Here, the areas of the magnetoresistance elements 13 (that is, the areas of the faces at which the spacer layers 13c are adjoined to the free ferromagnetic layers 13a), are adjusted to be substantially same in order to uniform the resistances of the magnetoresistance elements 13. Such-shaped magnetoresistance elements 13 compensate the reduction in the tolerance to the thermal disturbance resulting from the bias magnetic field developed by the yoke layers 14 in the x-axis direction.

As thus described, in this embodiment, the reduction in the tolerance to the thermal disturbance resulting from the bias magnetic field developed by the yoke layers 14 in the x-axis direction is cancelled, and thereby the reliability of the MRAM operation is improved.

Second Embodiment

Figure 4:
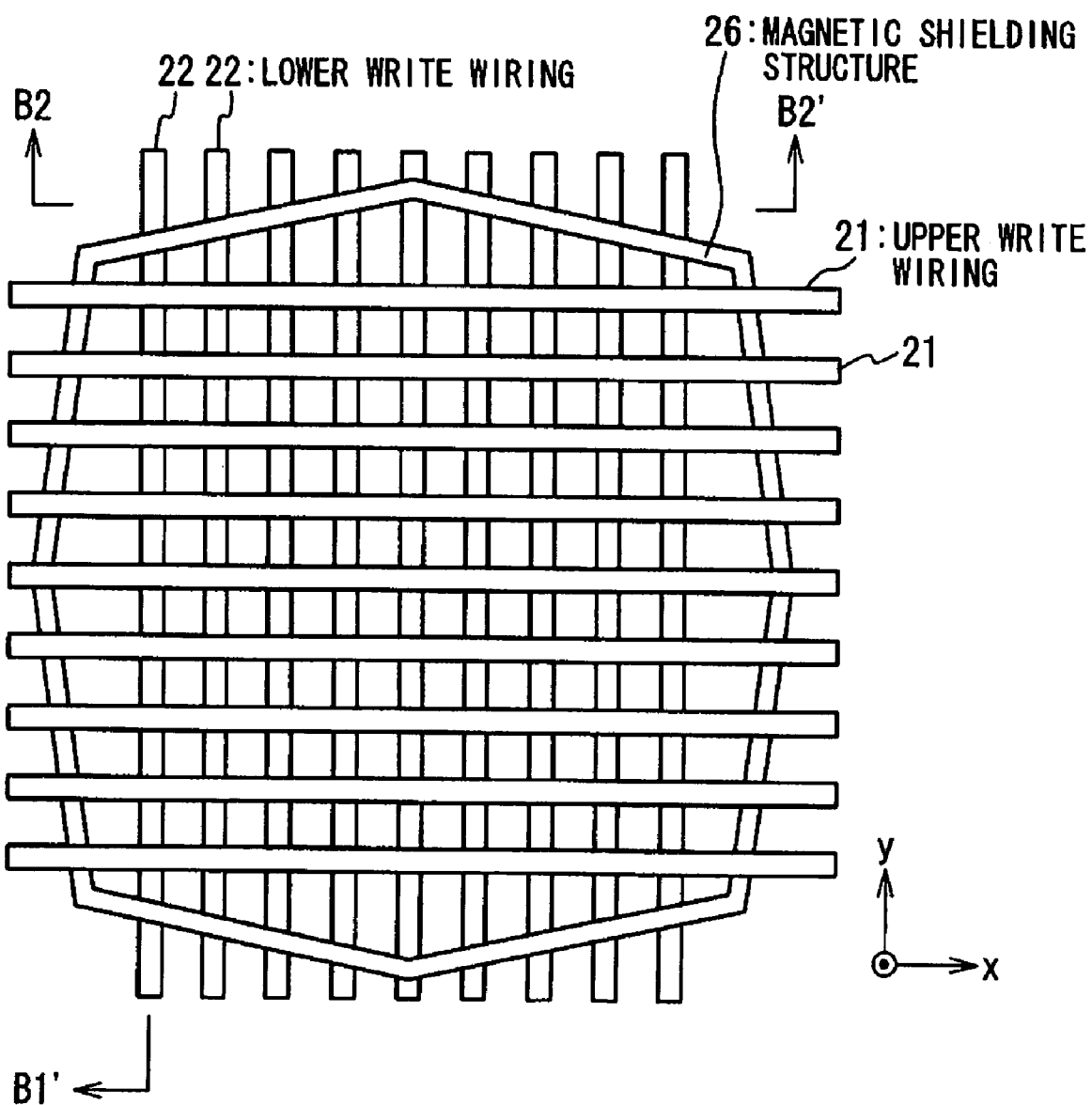
FIG. 4 is a top view illustrating a second embodiment of an MRAM according to the present invention.
Figure 5:
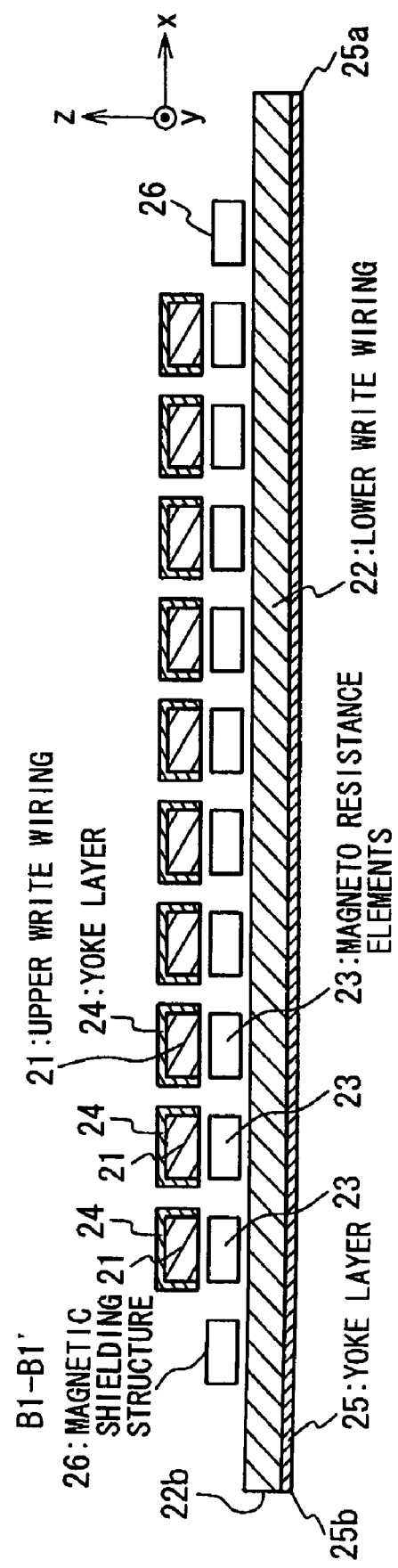
FIG. 5 is a section view illustrating the second embodiment of the MRAM according to the present invention.

In a second embodiment, as shown in FIG. 4, a plurality of upper write wirings 21 are disposed to extend in the x-axis direction, and a plurality of lower write wirings 22 are disposed to extend in the y-axis direction. As shown in FIG. 5, magnetoresistance elements 23 are disposed at respective intersections of the upper and lower write wirings 21 and 22. The magnetoresistance elements 23 are arranged in rows and columns to form a memory cell array. The magnetoresistance elements 23 each includes a free ferromagnetic layer (not shown), a fixed ferromagnetic layer (not shown), and a spacer layer (not shown) disposed therebetween. Each magnetoresistance element 23 stores one-bit data as the direction of the magnetization of the free ferromagnetic layer.

Figure 6:
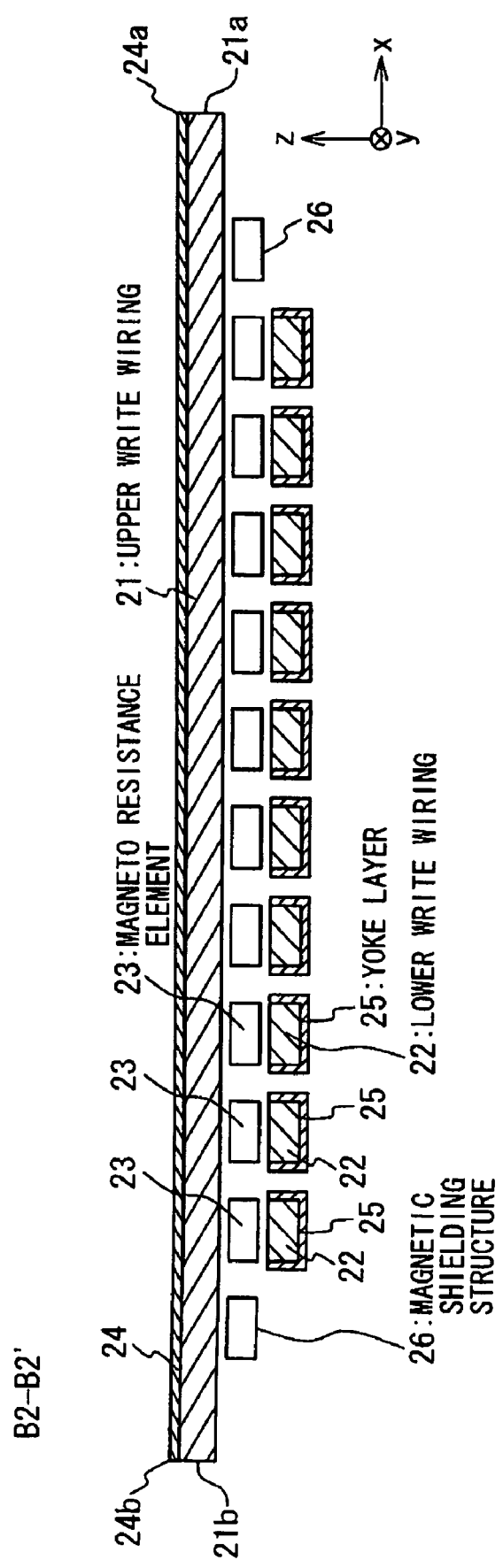
FIG. 6 is a section view illustrating the second embodiment of the MRAM according to the present invention.

As shown in FIG. 5, top and side surfaces of the upper write wirings 21 are covered with yoke layers 24 of ferromagnetic material. As shown in FIG. 6, the ends 24a and 24b of the yoke layers 24 are aligned with the ends 21a and 21b of the upper write wirings 21, respectively. The shape of the yoke layers 24, which are long along the x-axis direction, directs the magnetizations of the yoke layers 24 along the x-axis direction, allowing the yoke layers 24 to develop a bias magnetic field in the x-axis direction.

Correspondingly, bottom and side surfaces of the lower write wirings 22 are covered with yoke layers 25 of ferromagnetic material. As shown in FIG. 5, the ends 25a and 25b of the yoke layers 25 are aligned with the ends 22a and 22b of the lower write wirings 22, respectively. The shape of the yoke layers 25, which are long along the y-axis direction, directs the magnetizations of the yoke layers 25 along the y-axis direction, allowing the yoke layers 25 to develop a bias magnetic field in the x-axis direction.

As shown in FIG. 4, a magnetic shielding structure 26 including a magnetic film is formed to surround the memory cell array of the magnetoresistance elements 23 in a plane parallel to the x-y plane. As shown in FIG. 5, the magnetic shielding structure 26 is formed under the upper write wirings 21 and above the lower write wirings 22. As shown in FIG. 6, the magnetic shielding structure 26 passes between the ends 21a and 21b of the upper write wirings 21 (that is, the ends 24a and 24b of the yoke layers 24) and the array of the magnetoresistance elements 23. The magnetic shielding structure 26 thus structured attracts the bias magnetic field developed by the yoke layers 24 and 25 into the inside thereof, and thereby prevents the bias magnetic field from crossing the magnetoresistance elements 23. Owing to this effect, the magnetic shielding structure 26 effectively reduces the bias magnetic field applied to the magnetoresistance elements 23.

In order to further reduce the bias magnetic field applied to the magnetoresistance elements 23, the magnetic shielding structure 26 is formed to be convex towards the ends 21a and 21b of the upper write wirings 21, and the ends 22a and 22b of the lower write wirings 22, and to obliquely intersect the upper and lower write wirings 21 and 22. Such structure of the magnetic shielding structure 26 allows more of the bias magnetic field developed by the yoke layers 24 and 25 to pass through the magnetic shielding structure 26, being effective for reducing the bias magnetic field applied to the magnetoresistance elements 23.

Figure 7:
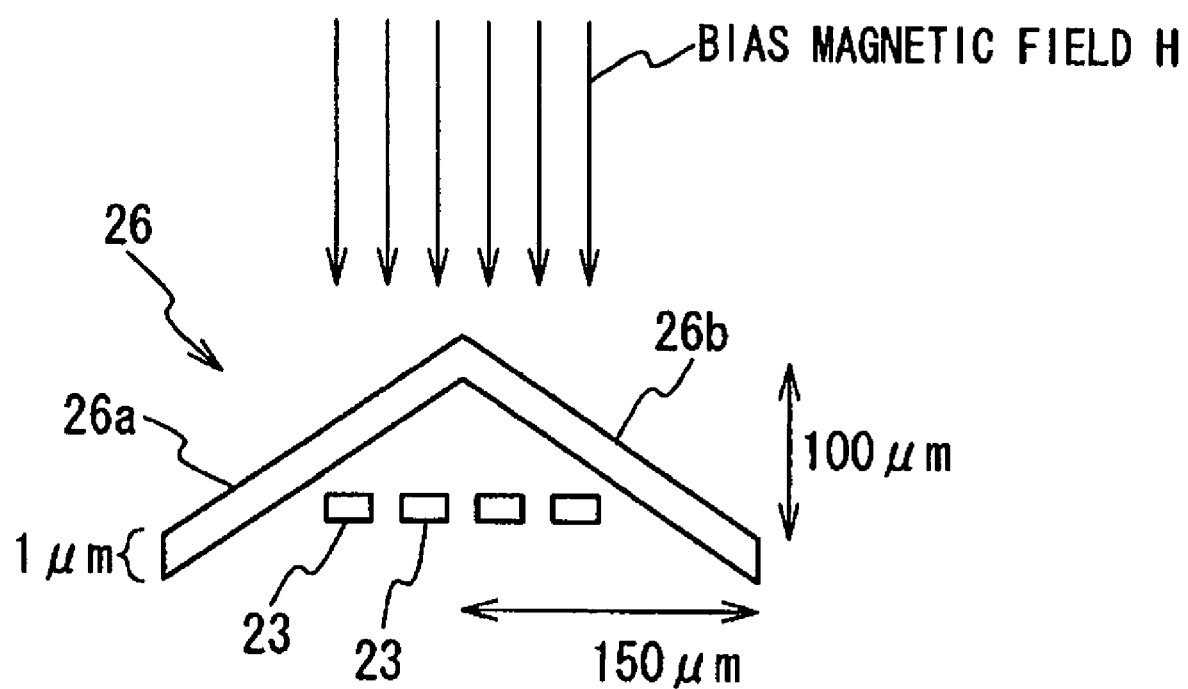
FIG. 7 is a diagram illustrating an effect of a magnetic shielding structure 26.
Figure 8:
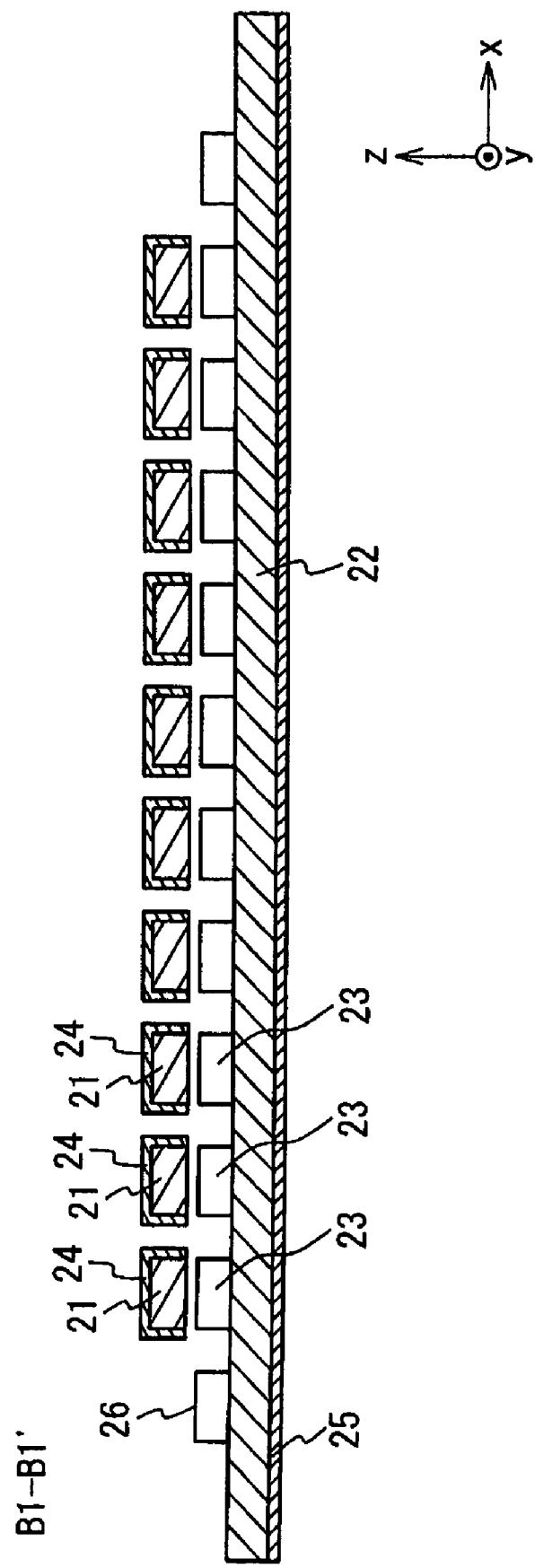
FIG. 8 is a section view illustrating a modification of the MRAM of the second embodiment.

Let us consider, for example, the shielding effects of portions 26a and 26b of the magnetic shielding structure 26 as shown in FIG. 7. The bias magnetic field H is applied to the direction towards the portions 26a and 26b. The portions 26a and 26b are V-shaped plates convex towards the upstream of the bias magnetic field H, being formed of NiFe film having a width of 1 µm and a thickness of 50 nm. The intensity of the magnetic field at the position downstream of the bias magnetic field H where the distance from the portions 26a and 26b is 3 µm is reduced down to or less than one-third of the magnetic field in the case where the magnetic shielding structure 26 is removed. Furthermore, the intensity of the magnetic field at the position where the distance from the portions 26a and 26b is 5 µm is reduced down to 60% of the magnetic field in the case where the magnetic shielding structure 26 is removed.

For simplifying the fabrication process of the MRAM, it is preferable in this embodiment to constitute the magnetic shielding structure 26 from a stack having the same structure as at least a portion of the magnetoresistance elements 23. For example, the magnetic shielding structure 26 may be formed of a stack having the same structure as the fixed ferromagnetic layers within the magnetoresistance elements 23, which each include a fixed ferromagnetic layer, a free ferromagnetic layer, and a spacer layer. Alternatively, the magnetic shielding structure 26 may be formed of a stack having the same structure as the fixed ferromagnetic layer, the free ferromagnetic layer, and the spacer layer.

Figure 9:
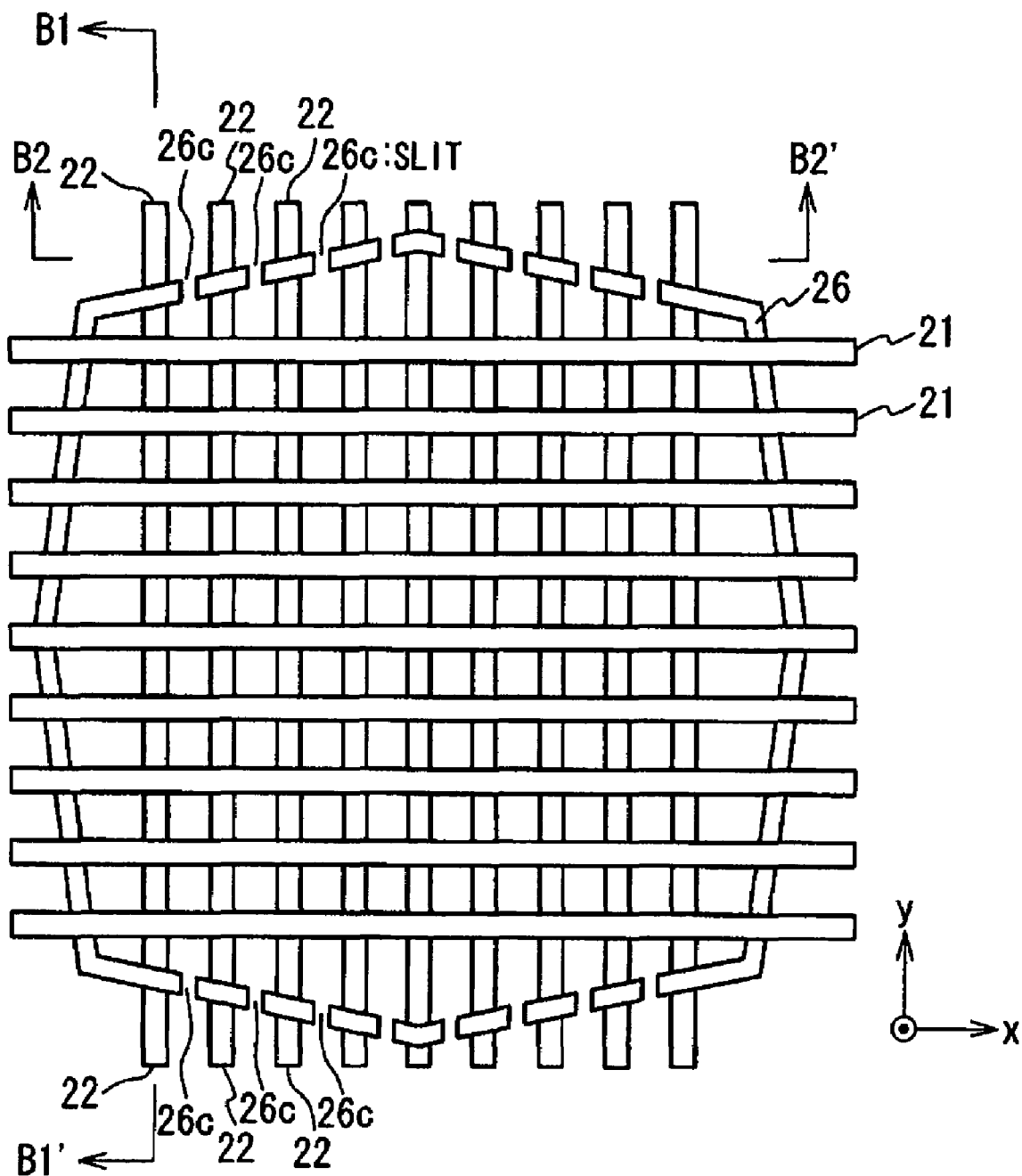
FIG. 9 is a plan view illustrating the modification of the MRAM of the second embodiment.

Furthermore, in this embodiment, the magnetic shielding structure 26 may be arranged in contact with the top surfaces of the lower write wirings 22. Such structure is preferable in the case where the magnetic shielding structure 26 is formed of a stack having the same structure as at least a portion of the magnetoresistance elements 23, and the magnetoresistance elements 23 are arranged in contact with the upper surfaces of the lower write wirings 22. When the magnetic shielding structure 26 is arranged in contact with the upper surfaces of the lower write wirings 26, as shown in FIG. 9, the magnetic shielding structure 26 is provided with slits 26c positioned between the lower write wirings 22. The slits 26c achieve electrical isolation between the adjacent lower write wirings 22. The widths of the slits 26c are selected as small as possible in the range where the lower write wirings 22 are electrically isolated one another.

Figure 10:
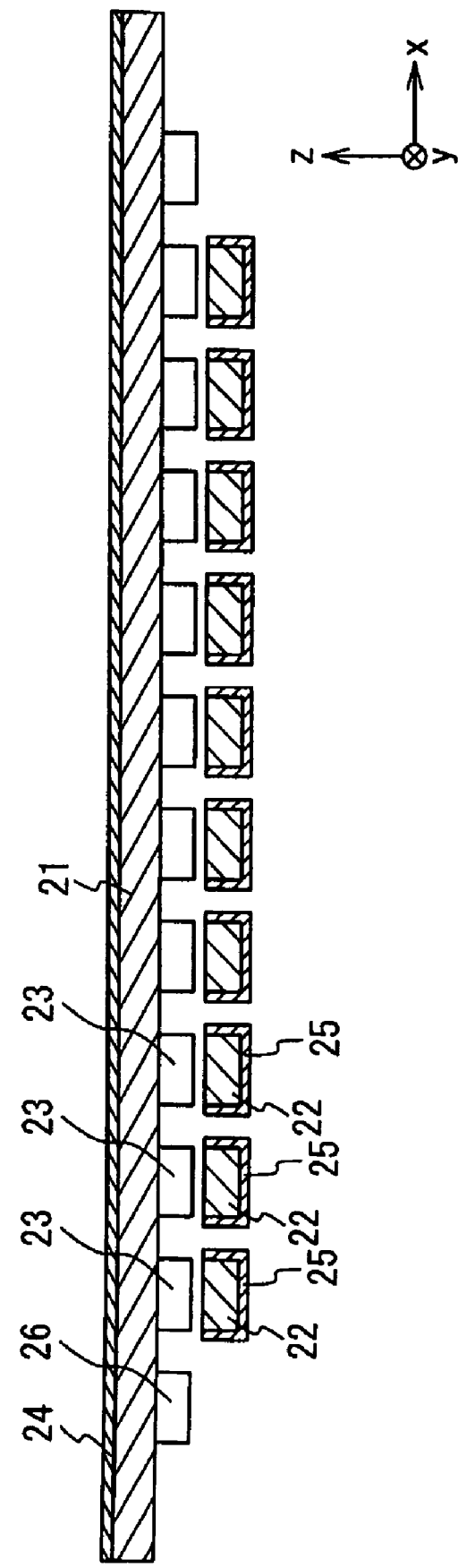
FIG. 10 is a section view illustrating another modification of the MRAM of the second embodiment.
Figure 11:
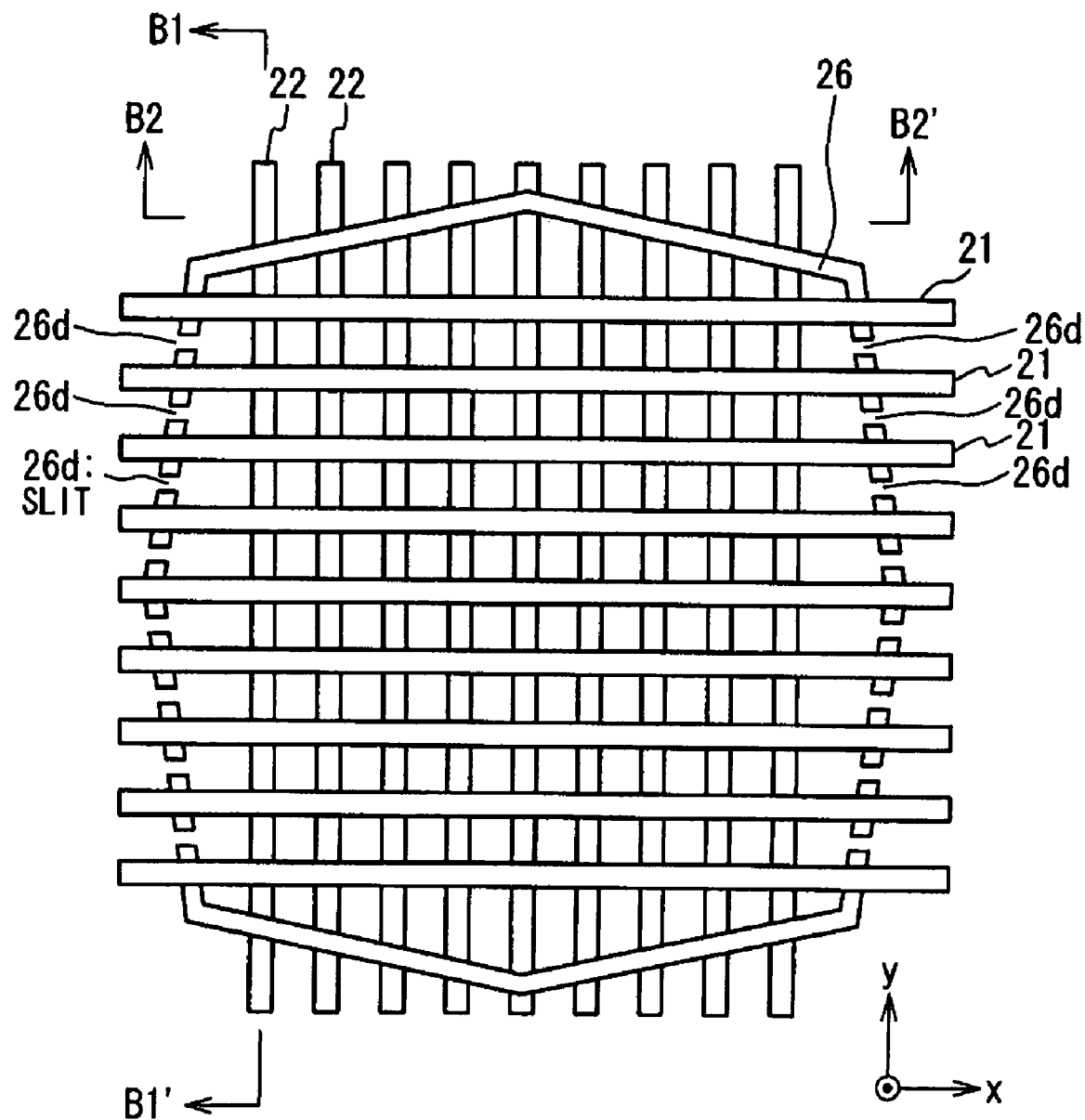
FIG. 11 is a plan view illustrating the other modification of the MRAM of the second embodiment.

Additionally, as shown in FIG. 10, the magnetic shielding structure 26 may be arranged in contact with the bottom surfaces of the upper write wirings 21. Such structure is preferable in the case where the magnetic shielding structure 26 is formed of a stack having the same structure as at least a portion of the magnetoresistance elements 23 and the magnetoresistance elements 23 are arranged in contact with the upper surfaces of the lower write wirings 22. When the magnetic shielding structure 26 is arranged in contact with the upper surfaces of the lower write wirings 22, as shown in FIG. 11, the magnetic shielding structure 26 is provided with slits 26d positioned between the upper write wirings 21. The slits 26d achieve electrical isolation between the adjacent upper write wirings 21. The widths of the slits 26d are selected as small as possible in the range where the upper write wirings 21 are electrically isolated one another.

Figure 13:
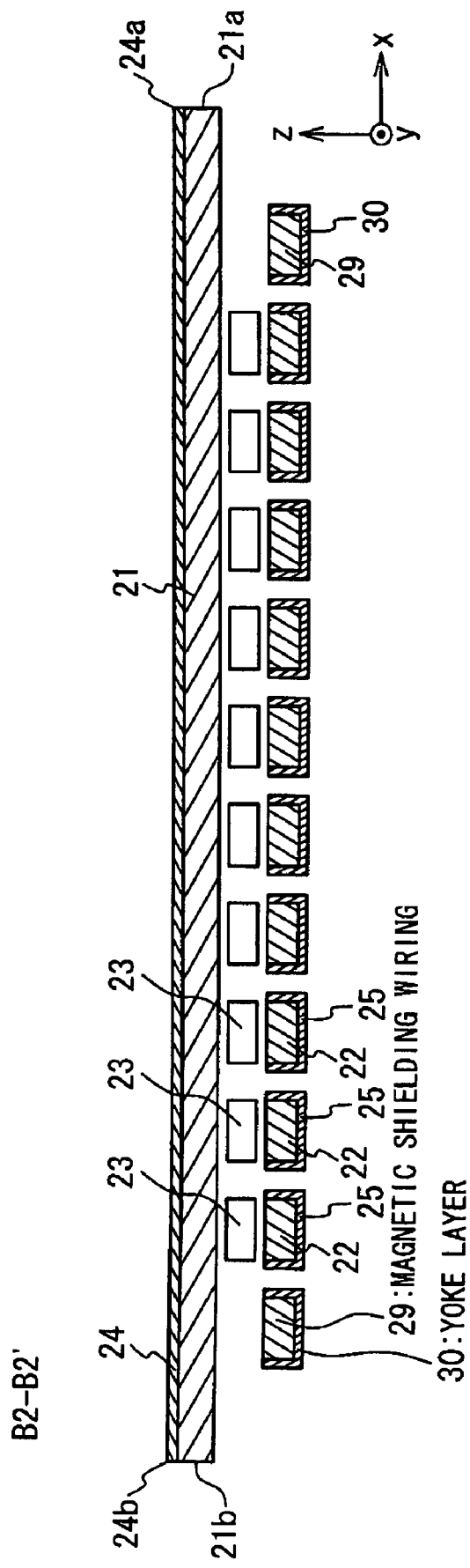
FIG. 13 is a section view illustrating the still other modification of the MRAM of the second embodiment.
Figure 14:
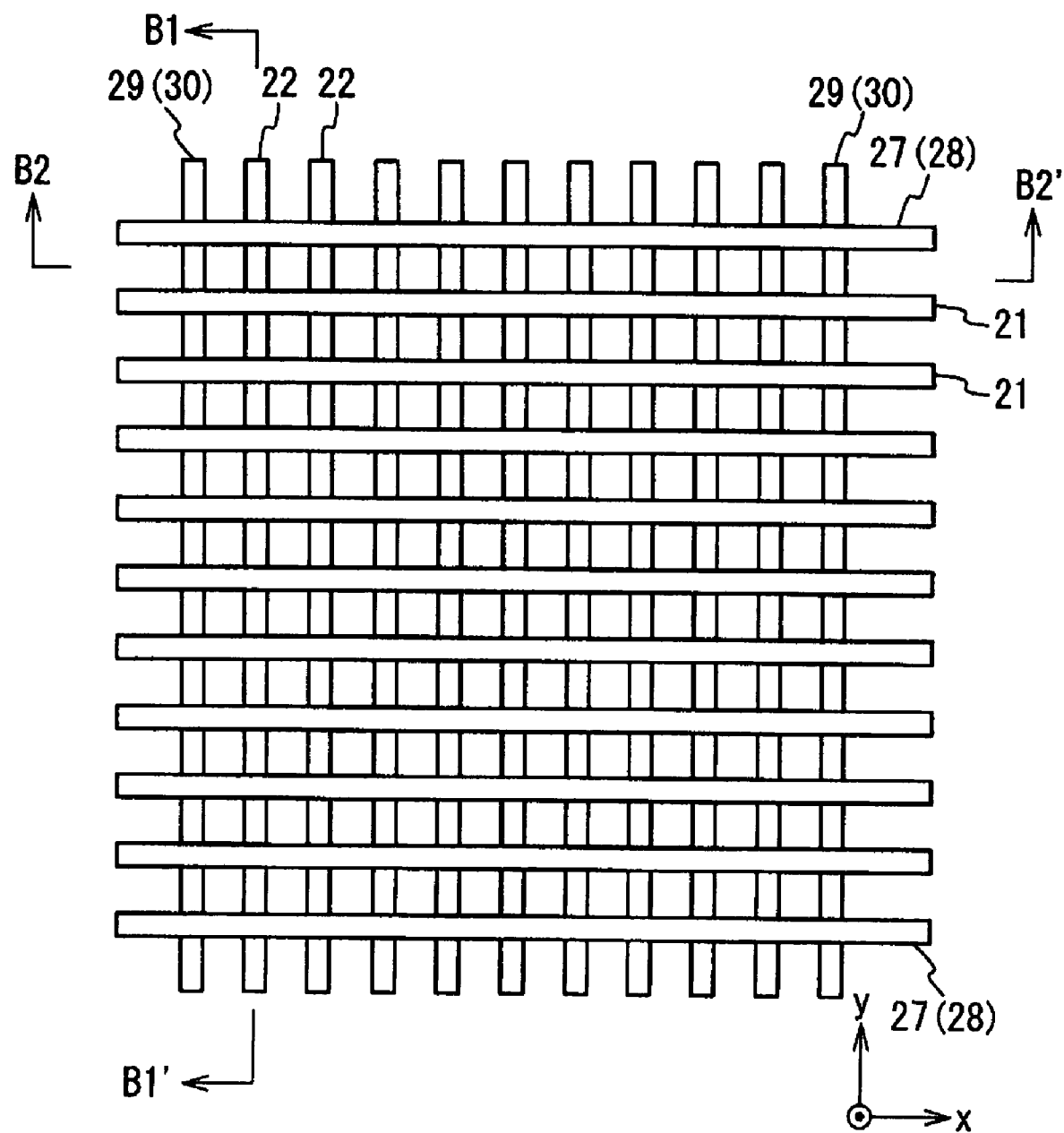
FIG. 14 is a plan view illustrating the still other modification of the MRAM of the second embodiment.

Moreover, in this embodiment, magnetic shielding wirings 27 covered with yoke layers 28 and magnetic shielding wirings 29 covered with yoke layers 30 may be provided in place of the magnetic shielding structure 26, as shown in FIGS. 12 and 13. As shown in FIG. 14, the magnetic shielding wirings 27 and the yoke layers 28 are disposed to extend in the x-axis direction, and the magnetic shielding wirings 29 and the yoke layers 30 are disposed to extend in the y-axis direction. The magnetic shielding wirings 27 and 29 are not used for writing data into the magnetoresistance elements 23. As shown in FIG. 12, the magnetic shielding wirings 27 and the yoke layers 28 have the same structure as the upper write wirings 21 and the yoke layers 24, and are disposed between the ends 22a and 22b of the lower write wirings 22 and the array of the upper write wirings 21. As shown in FIG. 13, the magnetic shielding wirings 29 and the yoke layers 30 have the same structure as the lower write wirings 21 and the yoke layers 25, and are disposed between the ends 21a and 21b of the upper write wirings 21 and the array of the lower write wirings 22. The yoke layers 28, which are provided on the side and upper surfaces of the magnetic shielding wirings 27, attract the bias magnetic field developed in the y-axis direction by the yoke layers 25 into the inside thereof, and effectively prevent the bias magnetic field from crossing the magnetoresistance elements 23. Additionally, the yoke layers 20, which are provided on the side and upper surfaces of the magnetic shielding wirings 29, attract the bias magnetic field developed in the x-axis direction by the yoke layers 24 into the inside thereof, and effectively prevent from the bias magnetic field from crossing the bias magnetic field from crossing the magnetoresistance elements 23.

Figure 15:
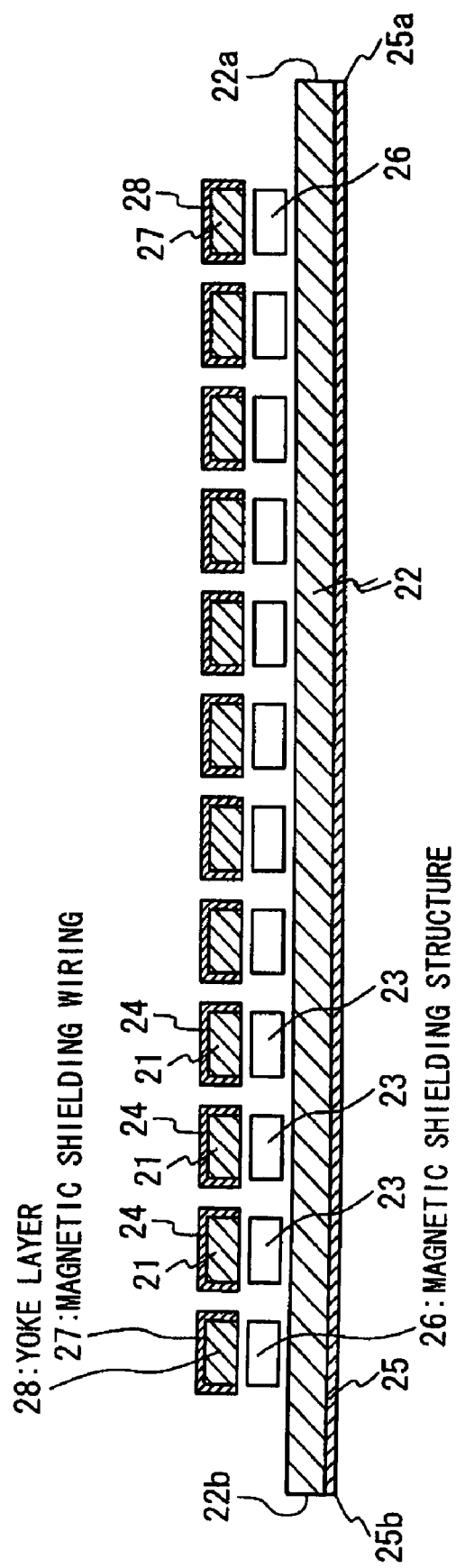
FIG. 15 is a section view illustrating still another modification of the MRAM of the second embodiment.
Figure 16:
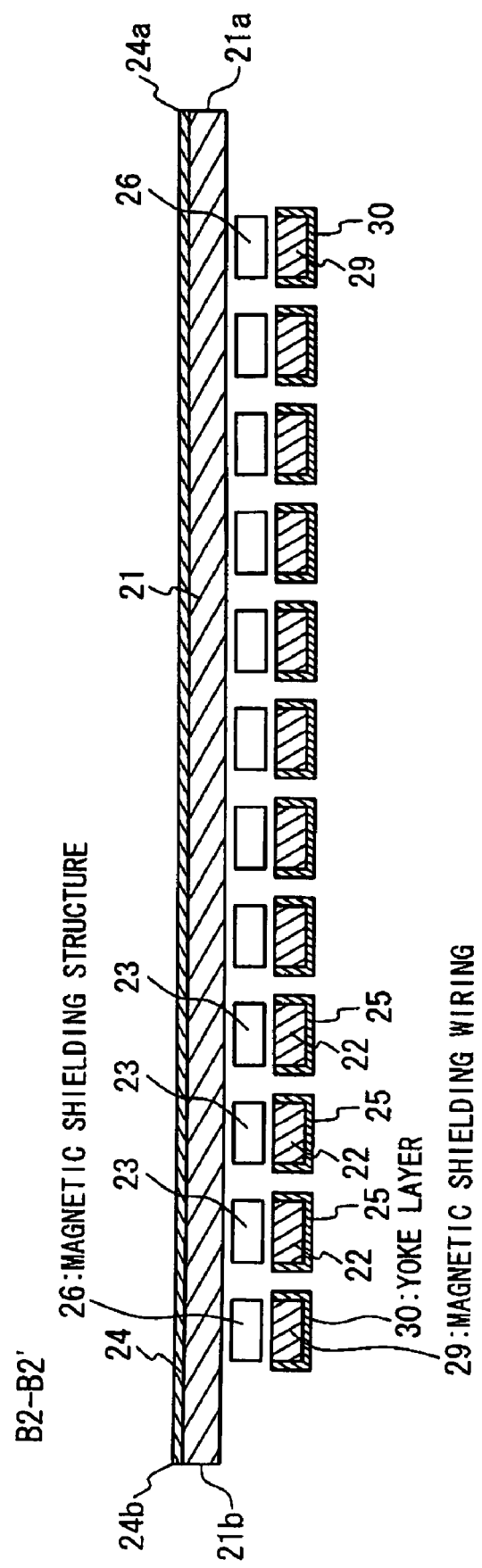
FIG. 16 is a section view illustrating the still other modification of the MRAM of the second embodiment.

Furthermore, in this embodiment, magnetic shielding wirings 27 covered with yoke layers 28 may be formed as shown in FIG. 15, and magnetic shielding wirings 29 covered with yoke layers 30 may be formed as shown in FIG. 16, in addition to the magnetic shielding structure 26. The use of the magnetic shielding structure 26 and the yoke layers 28 prevent the bias magnetic field developed in the y-axis direction by the yoke layers 25 from crossing the magnetoresistance elements 23, more effectively. Additionally, the use of the magnetic shielding structure 26 and the yoke layers 30 prevent the bias magnetic field developed in the x-axis direction by the yoke layers 24 from crossing the magnetoresistance elements 23, more effectively.

Third Embodiment

Figure 17:
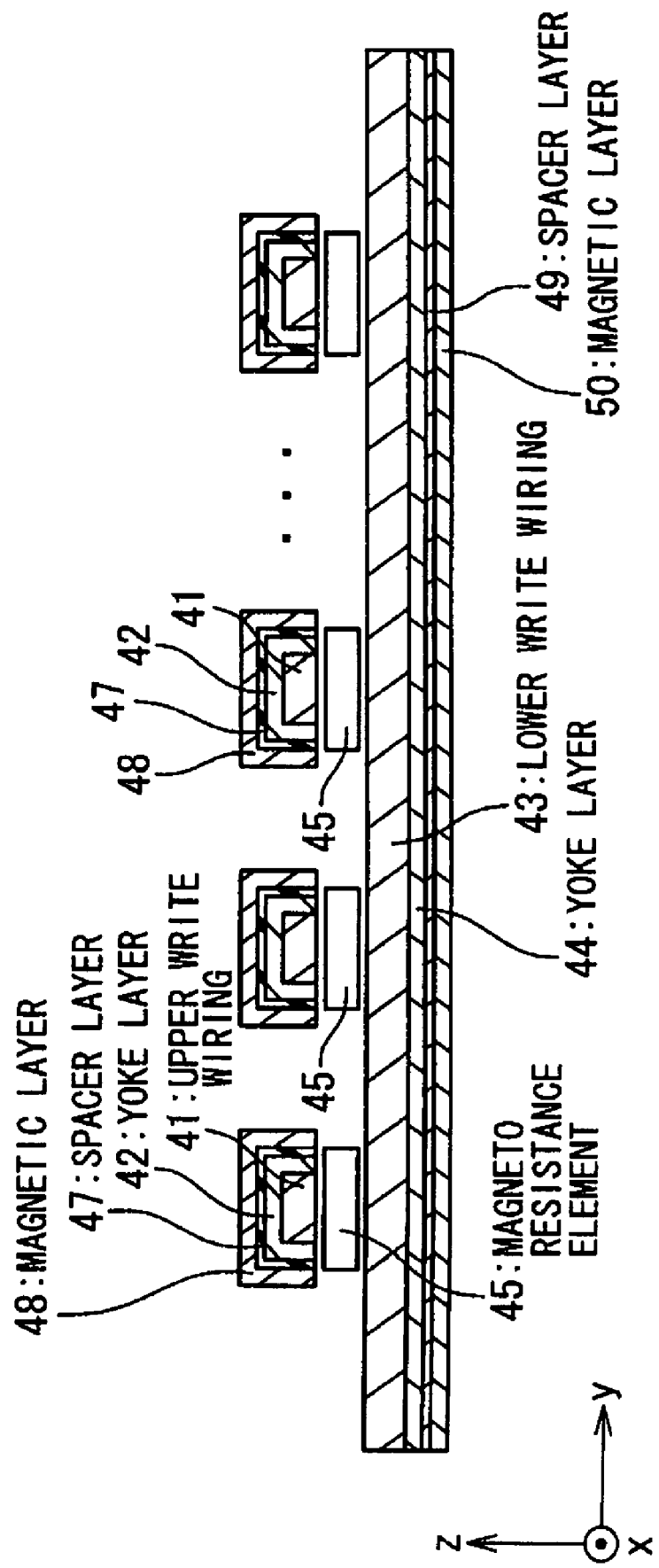
FIG. 17 is a section view illustrating a third embodiment of an MRAM according to the present invention.
Figure 18:
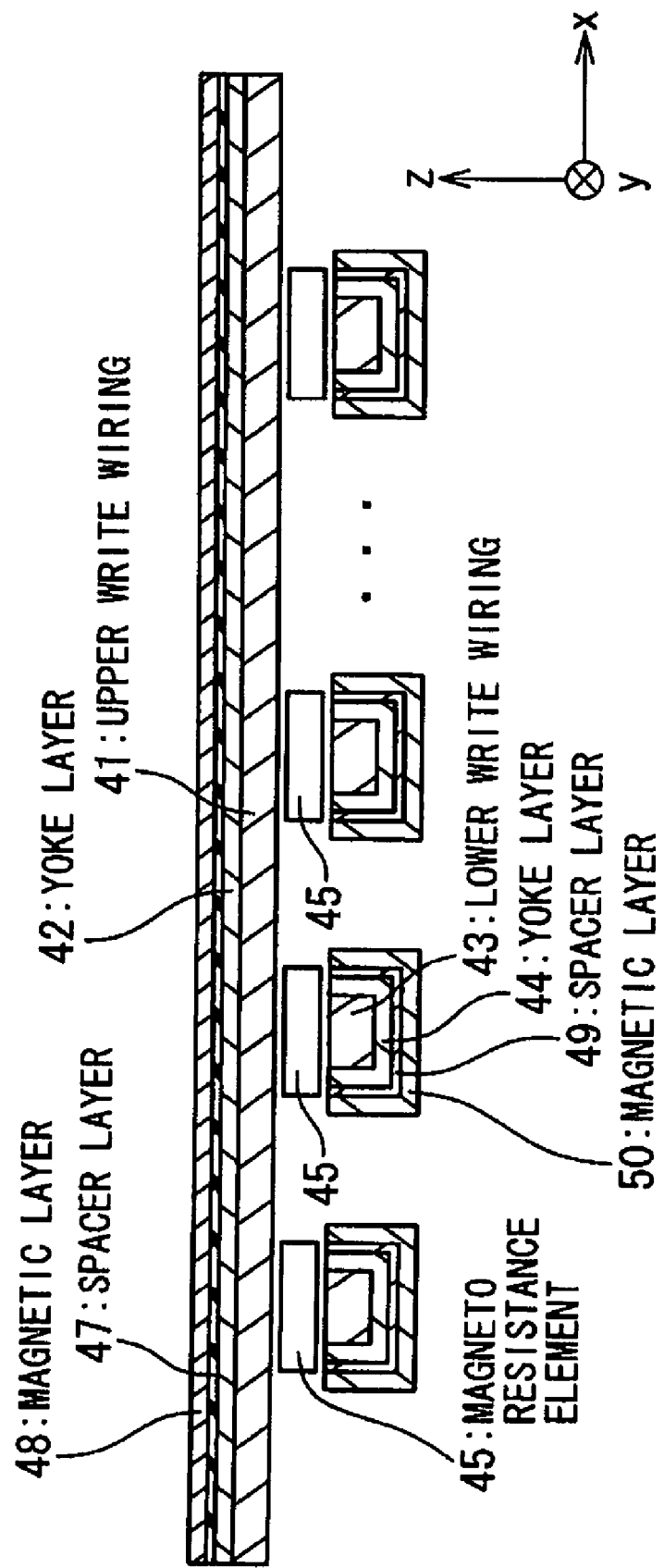
FIG. 18 is a section view illustrating the third embodiment of the MRAM according to the present invention.

FIGS. 17 and 18 illustrate an MRAM in a third embodiment of the present invention. In the third embodiment, a magnetic field developed by a magnetic pole appearing at one end of a yoke layer is introduced to the other end of the yoke layer, and the bias magnetic field applied to the magnetoresistance elements is thereby reduced.

In the third embodiment, upper write wirings 41 having side and upper surfaces covered with yoke layers 42 are disposed to extend in the x-axis direction, as shown in FIG. 18, and lower write wirings 43 having side and upper surfaces covered with yoke layers 44 are disposed to extend in the y-axis direction, as shown in FIG. 17. The yoke layers 42 and 44 are formed of conductive ferromagnetic material, such as NiFe. Magnetoresistance elements 45 are provided at respective intersections of the upper and lower write wirings 41 and 42.

As shown in FIG. 17, side and upper surfaces of the yoke layers 42, covering the upper write wirings 41, are covered with spacer layers 47, and side and upper surfaces of the spacer layers 47 are covered with magnetic layers 48 formed of ferromagnetic material. Referring to FIG. 18, two ends of the magnetic layers 48 in the x-axis direction are aligned to the two ends of the yoke layers 42, respectively. The yoke layers 42 and the magnetic layers 48, covering the upper write wirings 41 extended in the x-axis direction, have the shapes long along the x-axis direction. Therefore, the magnetizations of the yoke layers 42 and the magnetic layers 48 are directed in the x-axis direction due to the shape anisotropy. The magnetizations directed in the x-axis direction develop the magnetic poles at the ends of the yoke layers 42 and the magnetic layers 48 are directed in the x-axis direction.

Referring to FIG. 18, the magnetizations of the yoke layers 42 are directed in the opposite direction of the magnetizations of the magnetic layers 48, in order to prevent the magnetic field emitted from the magnetic poles at the ends of the yoke layers 42 from being applied to the magnetoresistance elements 45. This circulates more of the magnetic field developed by the magnetic poles at one ends of the yoke layers 42 to the other ends of the yoke layers 42 through the magnetic layers 48, and effectively prevents the bias magnetic field emitted from the magnetic poles at the ends of the yoke layers 42 from being applied to the magnetoresistance elements 45.

Let us consider, for example, a case where the yoke layers 42 are formed of NiFe films of 50 nm, and the magnetic layers 48 are formed of NiFe films of 50 nm, and the spacer layers 47 are formed of dielectric material having a thickness of 20 nm. In this case, the bias magnetic field applied to the magnetoresistance elements 45 by the yoke layers 42 is reduced down to one fiftieth or less by providing the magnetic layers 48.

In order to direct the magnetizations of the yoke layers 42 in the opposite direction of the magnetizations of the magnetic layers 48, the spacer layers 47 are magnetically designed not to provide ferromagnetic coupling between the yoke layers 42 and magnetic layers 48. Inappropriate design of the spacer layers 47 may ferromagnetically couple the yoke layers 42 and the magnetic layers 48 by exchange coupling. Ferromagnetic coupling between the yoke layers 42 and the magnetic layers 48 is undesirable, because the magnetizations of the yoke layers 42 are directed in the same direction as the magnetizations of the magnetic layers 48.

Preferably, the spacer layers 47 are designed to provide antiferromagnetic coupling between the yoke layers 42 and the magnetic layers 48. It is apparent to those skilled in the art that antiferromagnetic coupling can be obtained between the yoke layers 42 and the magnetic layers 48 by optimization of the material and thickness of the spacer layers 47. The spacer layers 47 are preferably designed to provide antiferromagnetic coupling between the yoke layers 42 and the magnetic layers 48 by antiferromagnetic exchange coupling.

The spacer layers 47 may be formed of insulating or conductive material. However, the spacer layers 47 are preferably formed of insulating material in order to increase the magnetic field that applied to the magnetoresistance elements 45 by the write currents through the upper write wirings 41. The fact that the spacer layers 47 are formed of insulating material reduces the effective diameter of the wirings through which the write currents are flown (that is, the upper write wirings 41 and the yoke layers 42), and increases the magnetic field applied to the magnetoresistance elements 45.

In order to make the magnetizations of the yoke layers 42 easily directed in the opposite direction of the magnetizations of the magnetic layers 48, the yoke layers 42 and magnetic layers 48 are designed to have different coercive fields. Different coercive fields of the yoke layers 42 and magnetic layers 48 allow the magnetizations of the yoke layers 42 and magnetic layers 48 to be directed in the opposite directions by applying an external field. Let us consider, for example, a case where the yoke layers 42 have a coercive field larger than that of the magnetic layers 48. In this case, it is possible to direct the magnetizations of the yoke layers 42 in the opposite direction of the magnetizations of the magnetic layers 48 by applying a first magnetic field larger than the coercive fields of both of the yoke layers 42 and magnetic layers 48 in a direction parallel to the x-axis direction, and then applying a second magnetic field that is larger than the coercive field of the magnetic layers 48 and is smaller than the coercive field of the yoke layers 42 in a direction opposite to the direction of the first magnetic field.

The yoke layers 44, the spacer layers 49, and the magnetic layers 50 are structured correspondingly to the yoke layers 42, the spacer layers 47 and the magnetic layers 48. As shown in FIG. 18, side and upper surfaces of the yoke layers 44, covering the lower write wirings 43, are covered with the magnetic layers 50 of ferromagnetic material. Referring to FIG. 17, two ends of the magnetic layers 50 in the y-axis direction are aligned to two ends of the yoke layers 44, respectively. The yoke layers 44 and the magnetic layers 50, covering the upper write wirings 41 extended in the y-axis direction, have the shapes long along the x-axis direction. Therefore, the magnetizations of the yoke layers 44 and the magnetic layers 50 are directed in the y-axis direction due to the shape anisotropy. The magnetizations directed in the y-axis direction develop the magnetic poles at the ends of the yoke layers 44 and the magnetic layers 50 are directed in the y-axis direction.

Referring to FIG. 18, the magnetizations of the yoke layers 44 are directed in the opposite direction of the magnetizations of the magnetic layers 50, in order to prevent the magnetic field emitted from the magnetic poles at the ends of the yoke layers 44 from being applied to the magnetoresistance elements 45. This circulates more of the magnetic field developed by the magnetic poles at one ends of the yoke layers 44 to the other ends of the yoke layers 44 through the magnetic layers 50, and effectively prevents the bias magnetic field emitted from the magnetic poles at the ends of the yoke layers 44 from being applied to the magnetoresistance elements 45.

In order to direct the magnetizations of the yoke layers 44 in the opposite direction of the magnetizations of the magnetic layers 50, the spacer layers 49 are magnetically designed not to provide ferromagnetic coupling between the yoke layers 44 and magnetic layers 50, preferably designed to provide antiferromagnetic coupling between the yoke layers 44 and the magnetic layers 49.

The spacer layers 49 may be formed of insulating or conductive material. However, the spacer layers 49 are preferably formed of insulating material in order to increase the magnetic field that applied to the magnetoresistance elements 45 by the write currents through the lower write wirings 41.

In order to make the magnetizations of the yoke layers 44 easily directed in the opposite direction of the magnetizations of the magnetic layers 50, the yoke layers 44 and magnetic layers 50 are designed to have different coercive fields. Different coercive fields of the yoke layers 44 and magnetic layers 50 allow the magnetizations of the yoke layers 44 and magnetic layers 50 to be directed in the opposite directions by applying an external field. When the yoke layers 42 have a coercive field larger than that of the magnetic layers 48, for example, it is possible to direct the magnetizations of the yoke layers 44 in the opposite direction of the magnetizations of the magnetic layers 50 by applying a first magnetic field larger than the coercive fields of both of the yoke layers 44 and magnetic layers 50 in a direction parallel to the y-axis direction, and then applying a second magnetic field that is larger than the coercive field of the magnetic layers 50 and is smaller than the coercive field of the yoke layers 44 in a direction opposite to the direction of the first magnetic field.

As thus describe, the structure of the MRAM in this embodiment magnetically couples the magnetic layers 48 and 50 with the yoke layers 42 and 44, respectively, and effectively prevents the bias magnetic field from being applied to the magnetoresistance elements 45.

Figure 19:
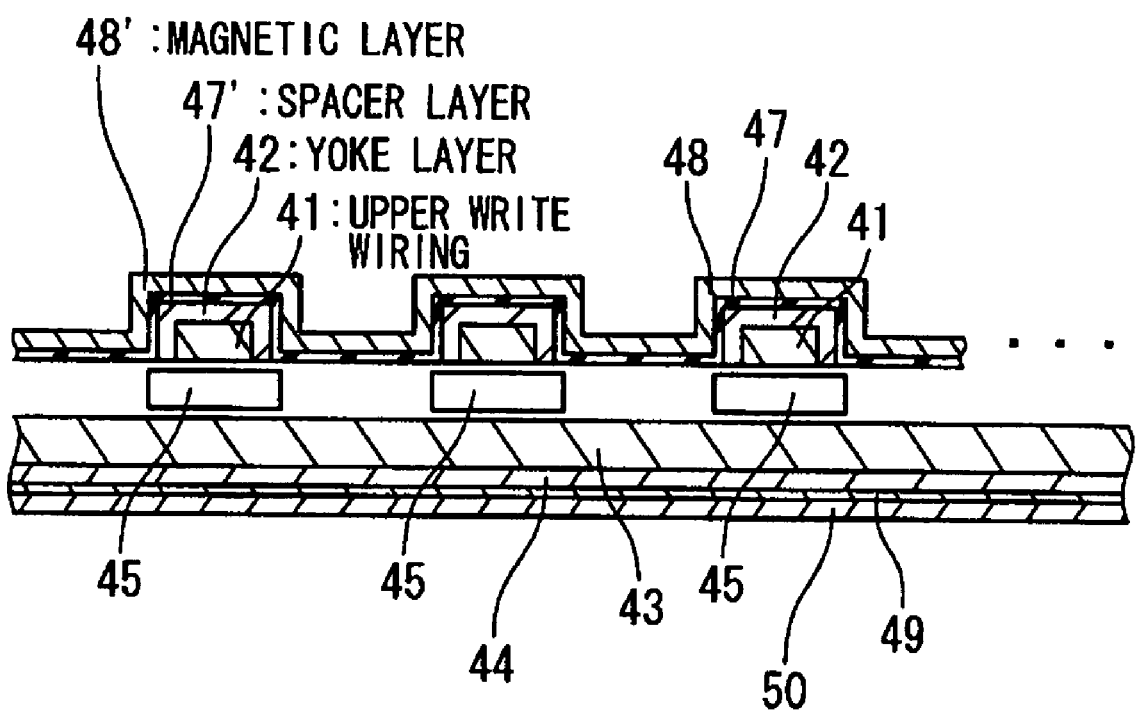
FIG. 19 is a section view illustrating a modification of the third embodiment of the MRAM according to the present invention.

In this embodiment, as shown in FIG. 19, a spacer layer 47 and a magnetic layer 48 may be formed to cover all of the upper write wirings 41 and yoke layers 43, when the spacer layer 47 is made of insulating material, instead of providing spacer layers 47 and magnetic layers 48 for the respective upper write wirings 41. The structure shown in FIG. 19 is advantageous due to the easiness of forming the magnetic layer 48. Correspondingly, a spacer layer 49 and a magnetic layer 50 may be formed to be single-membered, instead of providing spacer layers 49 and magnetic layers 50 for the respective lower write wirings 43.

Fourth Embodiment

Figure 20:
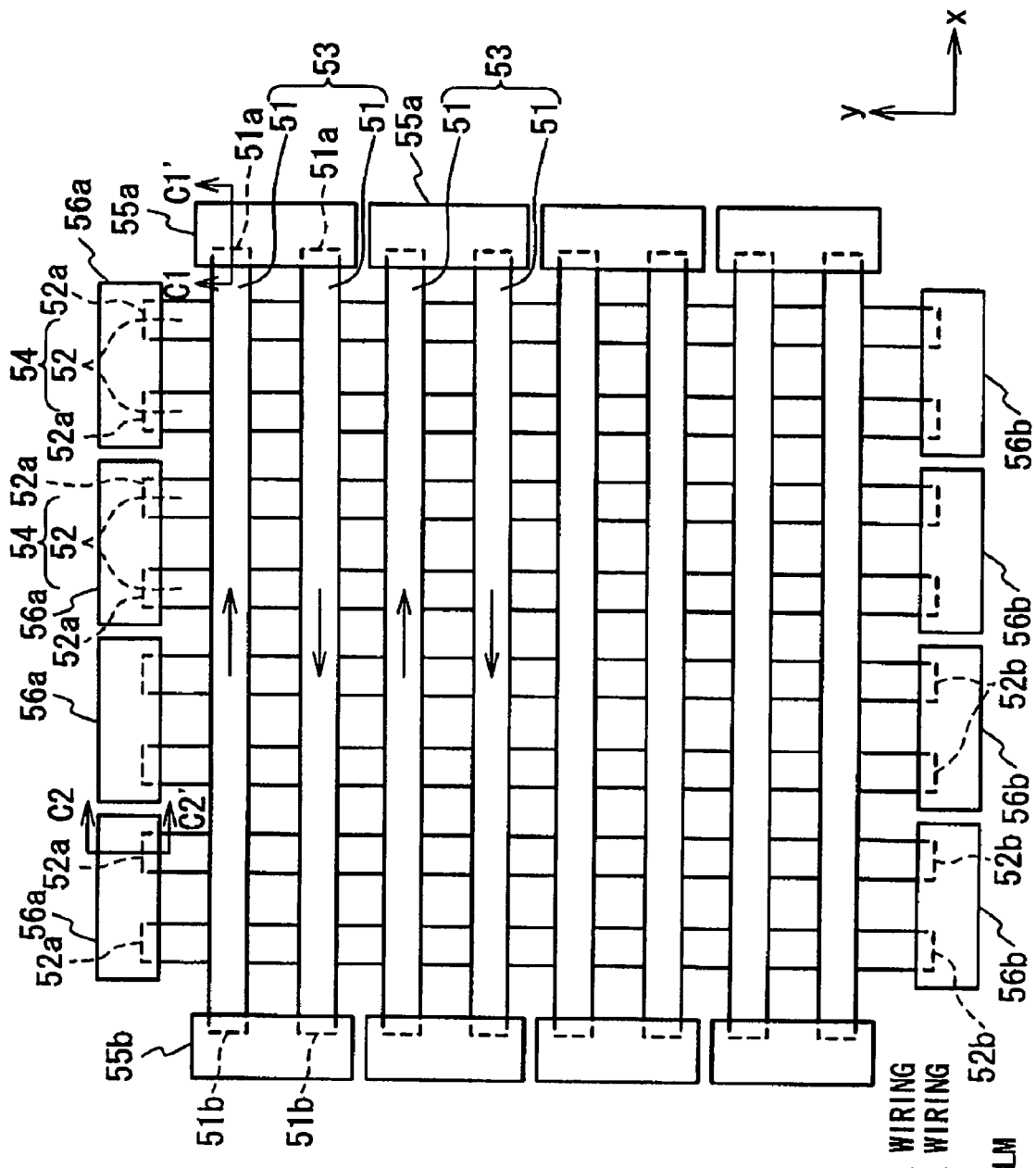
FIG. 20 is a plan view illustrating a fourth embodiment of an MRAM according to the present invention.

FIG. 20 illustrates a fourth embodiment of an MRAM according to the present invention. In the fourth embodiment, the magnetic field emitted from an end of a yoke layer covering a certain write wiring is introduced to an end of a yoke layer covering a different write wiring, and is circulated so that the magnetic field does not cross magnetoresistance elements. The bias magnetic field applied to the magnetoresistance elements is thereby reduced.

In detail, in the fourth embodiment, upper write wirings 51 having side and top surfaces covered with yoke layers are disposed to extend in the x-axis direction, and lower write wirings 52 having side and bottom surfaces covered with yoke layers are disposed to extend in the y-axis direction. The yoke layers are not illustrated in FIG. 20 for easiness of viewing the figure. The yoke layers are formed of conductive ferromagnetic material, such as NiFe. Magnetoresistance elements (not shown) are provided at respective intersections of the upper and lower write wirings 51 and 52. Every two of the upper write wirings 51 adjacent in the y-axis direction form a wiring set 53, and every two of the lower write wirings 52 adjacent in the x-axis direction form a wiring set 54.

Figure 21:
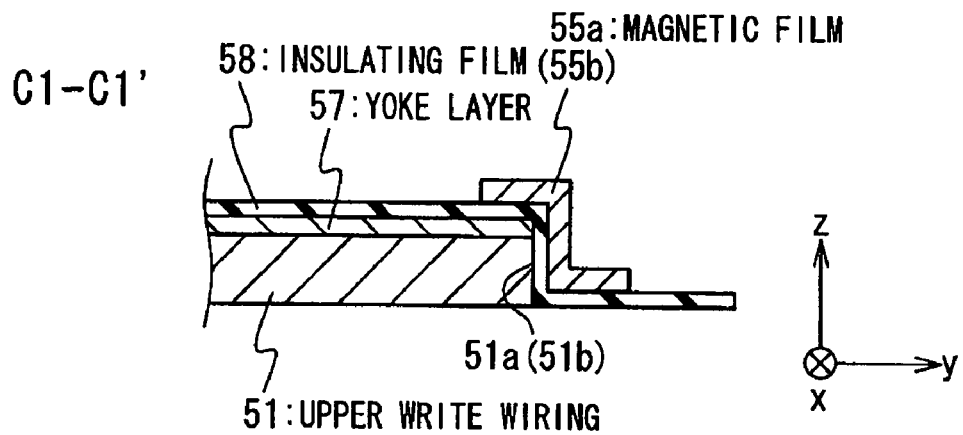
FIG. 21 is a section view illustrating the fourth embodiment of the MRAM according to the present invention.

Conductive magnetic films 55a are each disposed to overlap first ends 51a of two upper write wirings 51 belonging to a wiring set 53, and conductive magnetic films 55b are each disposed to overlap second ends 51a of the two upper write wirings 51 belonging to the wiring set 53. FIG. 21 is a section view illustrating a structure in the vicinity of the first ends 51a (and the second ends 51b) of the upper write wirings 51. Top and side surfaces of the upper write wirings 51 are covered with yoke layers 57. The first ends 51a (and the second ends 51b) of the upper write wirings 51 and the yoke layers 57 are covered with an insulating film 58, and the magnetic films 55a and 55b are provided on the insulating film 58. The insulating film 58 electrically isolates the two upper write wirings 51. The ends of the yoke layers 57 in the x-axis direction are opposed to the magnetic films 55a and 55b across the insulating film 58.

Such structure provides magnetic coupling between the yoke layers 57 and the magnetic layers 55a and 55b. The yoke layers 57, which cover the upper write wirings 51, are shaped to be long along the x-axis direction, and the magnetizations of the yoke layers 57 are directed in parallel to the x-axis direction due to the shape anisotropy. Therefore, magnetic poles appear at the ends of the yoke layers 57 in the x-axis direction. The magnetic poles appearing at the ends of the yoke layers 57 are magnetically coupled with the magnetic layers 55a and 55b, because the ends of the yoke layers 57 are opposed to the magnetic layers 55a and 55b.

Figure 22:
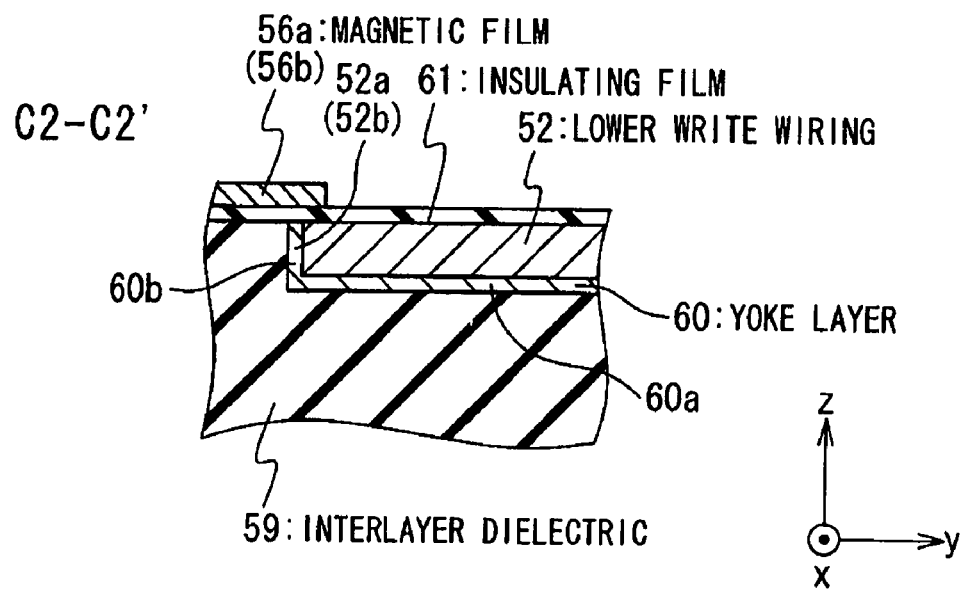
FIG. 22 is a section view illustrating the fourth embodiment of the present invention.

Correspondingly, as shown in FIG. 20, conductive magnetic films 56a are each disposed to overlap first ends 52a of two lower write wirings 52 belonging to a wiring set 54, and conductive magnetic films 56b are each disposed to overlap second ends 52a of the two lower write wirings 52 belonging to the wiring set 54. FIG. 22 is a section view illustrating a structure in the vicinity of the first ends 52a (and the second ends 52b) of the lower write wirings 52. The lower write wirings 52 are embedded into grooves provided for an interlayer dielectric 59. Bottom and side surfaces of the lower write wirings 52 are covered with yoke layers 60. It should be noted that the ends of the lower write wirings 52 in the y-axis direction are also covered with the yoke layers 60. In other words, the yoke layers 60 are composed of bottom-covering portions 60a attached in contact with the bottom surfaces of the lower write wirings 52, and end portions 60b covering the ends of the lower write wirings 52 in the y-axis direction. The lower write wirings 52, the interlayer dielectric 59, and the yoke layers 60 are covered with an insulating film 61. The magnetic films 56a and 56b are disposed on the insulating film 61. The insulating film 61 electrically isolates the two lower write wirings 52. The top ends of the end portions 60b of the yoke layers 60 are opposed to the magnetic films 56a (and 56b) across the insulating film 61.

Such structure provides magnetic coupling between the yoke layers 60 and the magnetic layers 56a and 56b. The bottom-covering portions 60a of the yoke layers 60, which cover the lower write wirings 52, are shaped to be long along the x-axis direction, and the magnetizations of the bottom-covering portions 60a are directed in parallel to the x-axis direction due to the shape anisotropy. Additionally, since the end portions 60b of the yoke layers 60 extend upward (in the z-axis direction), the magnetizations of the end portions 60b are directed in the z-axis direction. Therefore, magnetic poles appear at the top ends of the end portions 60b of the yoke layers 60. The magnetic poles appearing at the top ends of the end portions 60b of the yoke layers 60 are magnetically coupled with the magnetic layers 55a and 55b, because the top ends of the end portions 60b of the yoke layers 60 are opposed to the magnetic layers 56a (and 56b).

With reference to FIG. 20, the magnetizations of two yoke layers 57 covering the upper write wirings 51 associated with one wiring set 53 are directed in the opposite directions each other. This circulates the bias magnetic field developed by the yoke layers 57, and prevents the bias magnetic field from crossing the magnetoresistance elements. Substantially all the bias magnetic field developed by one of two yoke layers 57 within one wiring set 53 is introduced to the other yoke layer 57 through the magnetic films 55a and 55b, since the yoke layers 57 are magnetically coupled with the magnetic layers 55a and 55b. This implies that the yoke layers 57 and the magnetic films 55a and 55b form closed magnetic paths. Therefore, substantially no bias magnetic field developed by the yoke layers 57 crosses the magnetoresistance elements.

Correspondingly, the magnetizations of two yoke layers 60 covering the upper write wirings 52 associated with one wiring set 54 are directed in the opposite directions each other. This circulates the bias magnetic field developed by the yoke layers 60, and prevents the bias magnetic field from crossing the magnetoresistance elements. Substantially all the bias magnetic field developed by one of two yoke layers 60 within one wiring set 54 is introduced to the other yoke layer 60 through the magnetic films 56a and 56b, since the yoke layers 60 are magnetically coupled with the magnetic layers 55a and 55b. This implies that the yoke layers 60 and the magnetic films 56a and 56b form closed magnetic paths. Therefore, substantially no bias magnetic field developed by the yoke layers 60 crosses the magnetoresistance elements.

The magnetizations of two yoke layers 57 covering two upper write wirings 51 within a single wiring set 53 can be directed in the opposite directions each other through the following process. After the MRAM shown in FIG. 20 is fabricated, the MRAM is subjected to heat treatment at a temperature higher than the Curie temperature of the yoke layers 57. Getting back the MRAM to the room temperature results in that the magnetizations of the two yoke layers 57 covering the two upper write wirings 51 within the wiring set 53 are spontaneously directed in the opposite directions, since the potential energy of the magnetizations is minimum when the magnetizations of two yoke layers 57 covering the upper write wirings 51 within the wiring set 53 are directed in the opposite directions.

Correspondingly, the magnetizations of two yoke layers 60 covering two lower write wirings 52 within a single wiring set 54 can be directed in the opposite directions each other.

As thus described, the MRAM in this embodiment confines the bias magnetic field developed by the yoke layers 57 and 60 covering the respective upper and lower write wirings 51 and 52 is confined within the closed magnetic paths, and prevents the bias magnetic field from crossing the magnetoresistance elements.

In this embodiment, the structures in the vicinities of the end portions of the upper and lower write wirings 51 and 52 may be variously modified.

Figure 23:
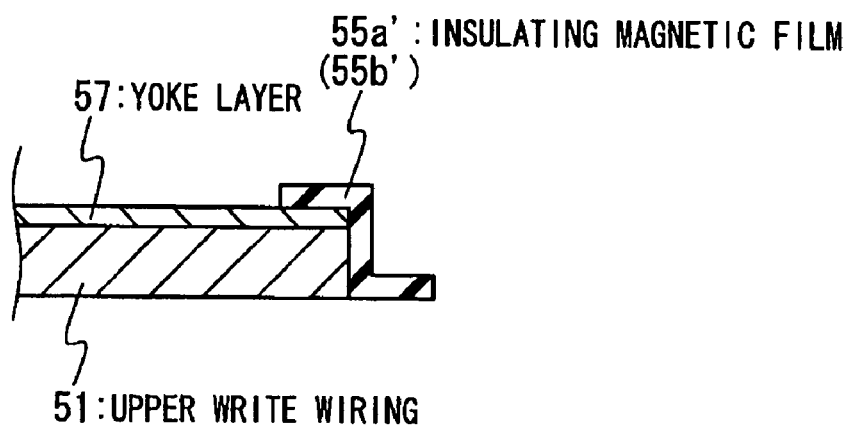
FIG. 23 is a section view illustrating a modification of the fourth embodiment of the MRAM according to the present invention.

FIG. 23 illustrates a modification of the structure in the vicinities of the end portions of the upper write wirings 51. As shown in FIG. 23, insulating magnetic films 55a' and 55b' may be used in place of the conductive magnetic films 55a and 55b. In this case, the insulating magnetic films 55a' and 55b' may be formed directly in contact with the yoke layers 57. The direct contact of the insulating magnetic films 55a' and 55b' with the yoke layers 57 enhances the magnetic couplings between the insulating magnetic films 55a' and 55b' and the yoke layers 57, and allows providing more-perfectly closed magnetic paths.

Figure 24:
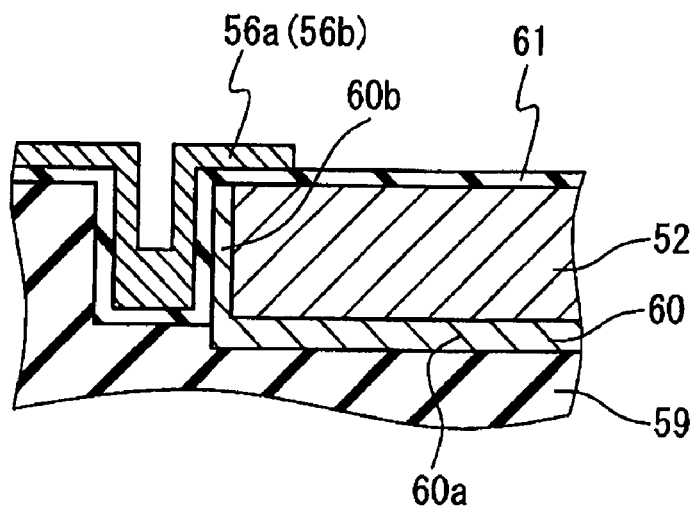
FIG. 24 is a section view illustrating another modification of the fourth embodiment of the MRAM according to the present invention.
Figure 25:
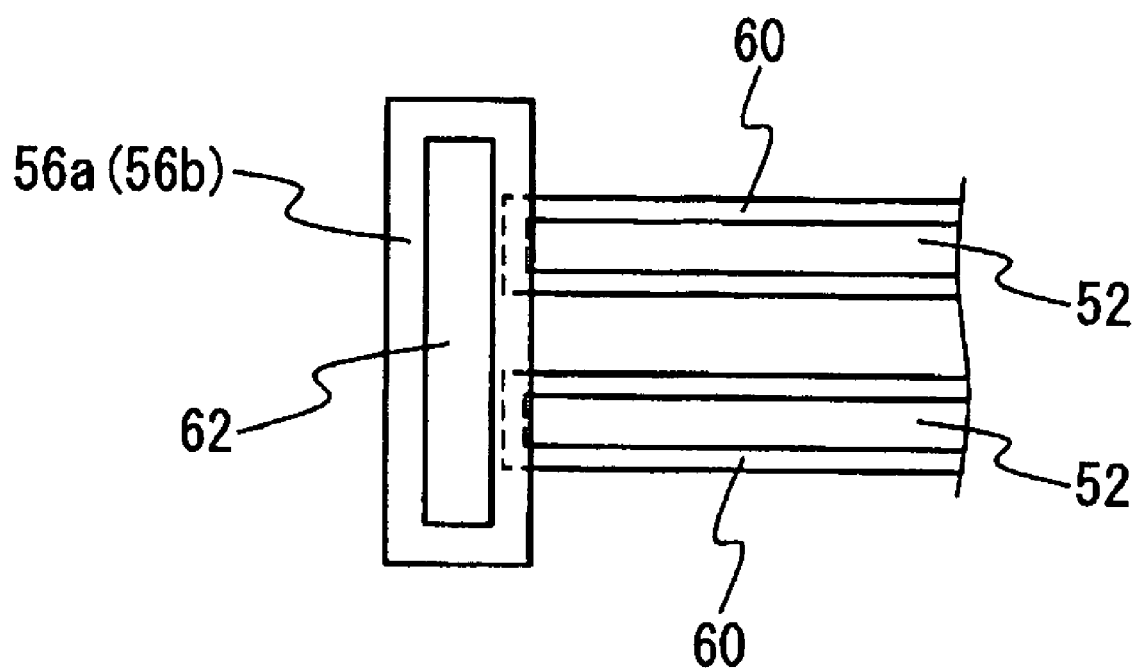
FIG. 25 is a plan view illustrating the other modification of the fourth embodiment of the MRAM according to the present invention.

FIGS. 24 and 25 illustrate a modification of the structure in the vicinities of the end portions of the lower write wirings 52. As shown in FIG. 24, grooves are formed on the interlayer dielectric 59 to face the end portions 62b of the yoke layers 60, and the inner surfaces of the grooves are covered with an insulating film 61. The magnetic films 56a and 56b are formed on the insulating film 61 to cover the inner surfaces of the grooves. As shown in FIG. 25, forming the grooves on the interlayer dielectric 59 results in that the magnetic films 56a and 56b are formed to provide concaved portions 62. Such structure allows the magnetic films 56a and 56b to face larger areas of the end portions 60b of the yoke layers 60, and enhances the magnetic couplings between the magnetic films 56a and 56b and the yoke layers 60. This is preferable for providing more-perfectly closed magnetic paths.

Figure 26:
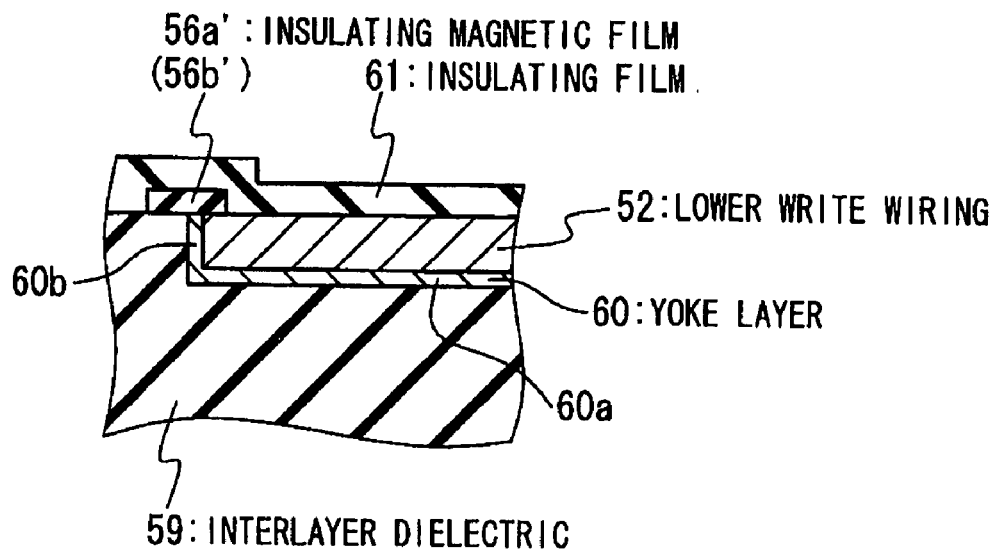
FIG. 26 is a section view illustrating still another modification of the fourth embodiment of the MRAM according to the present invention.
Figure 27:
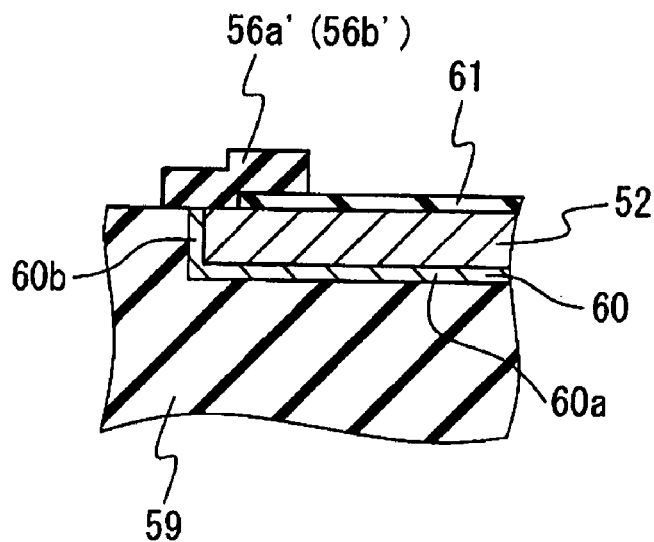
FIG. 27 is a section view illustrating the still other modification of the fourth embodiment of the MRAM according to the present invention.

Furthermore, as shown in FIGS. 26 and 27, insulating magnetic films 56a' and 56b may be used in place of the conductive magnetic films 56a and 56b. In this case, the insulating magnetic films 56a' and 56b' may be formed directly in contact with the yoke layers 60. As shown in FIG. 26, for example, the insulating magnetic films 56a' and 56b' may be covered with the insulating film 61. As shown in FIG. 27, the insulating film 61 may be formed not to cover the end portions 60a of the yoke layers 60, and the insulating magnetic films 56a' and 56b' may be formed to cover the end portions 60a of the yoke layers 60, and to overlap the insulating film 61. The direct contact of the insulating magnetic films 56a' and 56b' with the yoke layers 60 enhances the magnetic couplings between the insulating magnetic films 56a' and 56b' and the yoke layers 60, and allows providing more-perfectly closed magnetic paths.

Figure 28:
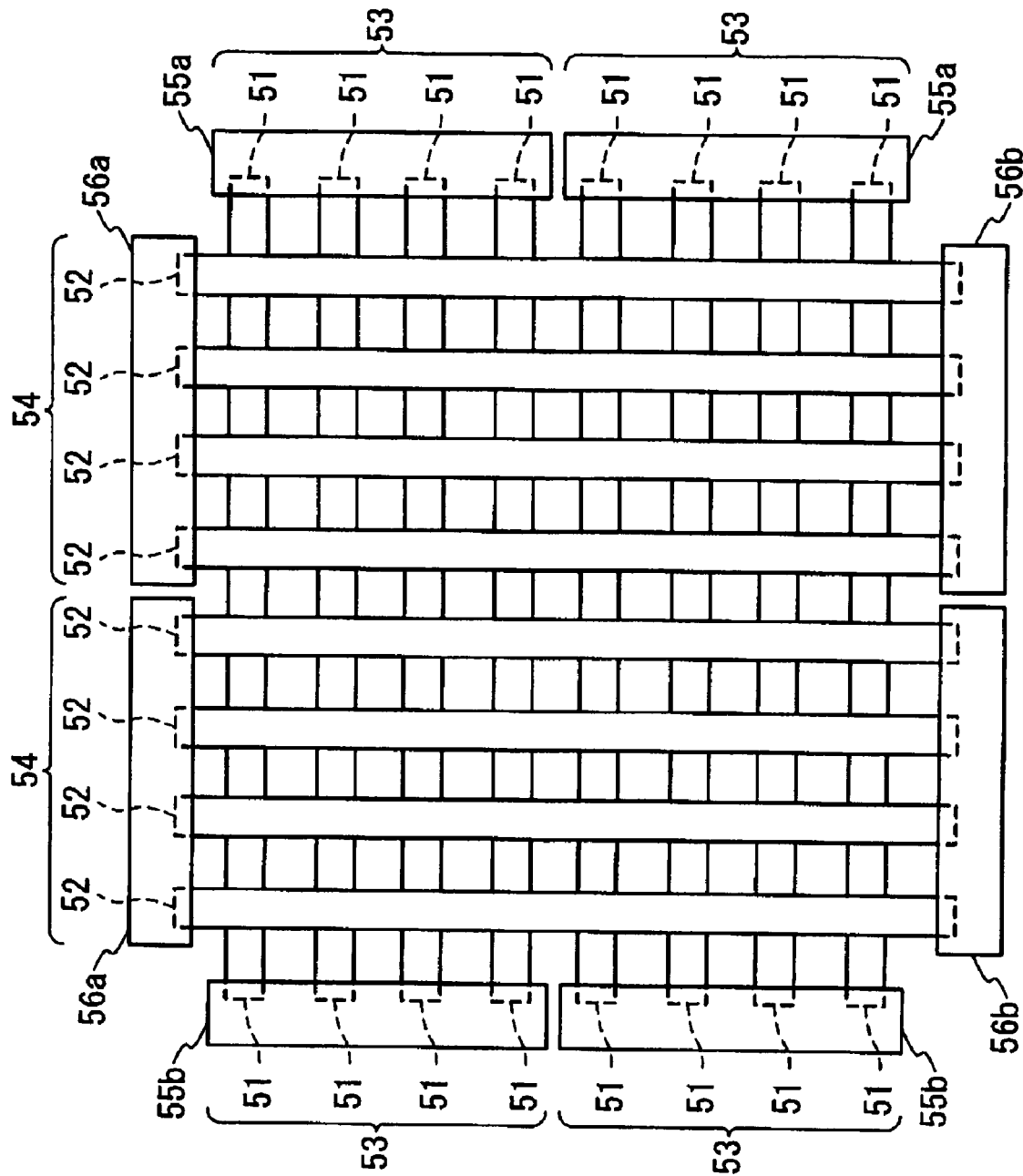
FIG. 28 is a plan view illustrating the still other modification of the fourth embodiment of the MRAM according to the present invention.

As shown in FIG. 28, the number of upper write wirings 51 belonging to one wiring set 53, and the number of upper write wirings 52 belonging to one wiring set 54 are not limited to two. For example, one wiring set 53 may be membered with four upper write wirings 51, and one wiring set 54 may be membered with four lower write wirings 52.

The magnetizations of the yoke layers 57 can be directed by thermal treatment so that the yoke layers 57, the magnetic films 55a and 55b provide closed magnetic paths, even when the number of upper write wirings 51 belonging to one wiring set 53 is not two. The magnetizations of the yoke layers 57 are directed by subjecting the MRAM to heat treatment at a temperature higher than the Curie temperature of the yoke layers 57 and then getting back the MRAM to the room temperature so that the yoke layers 57, the magnetic films 55a and 55b provide closed magnetic paths.

Correspondingly, the magnetizations of the yoke layers 60 can be directed by thermal treatment so that the yoke layers 60, the magnetic films 56a and 56b provide closed magnetic paths, even when the number of lower write wirings 52 belonging to one wiring set 54 is not two.

Figure 29:
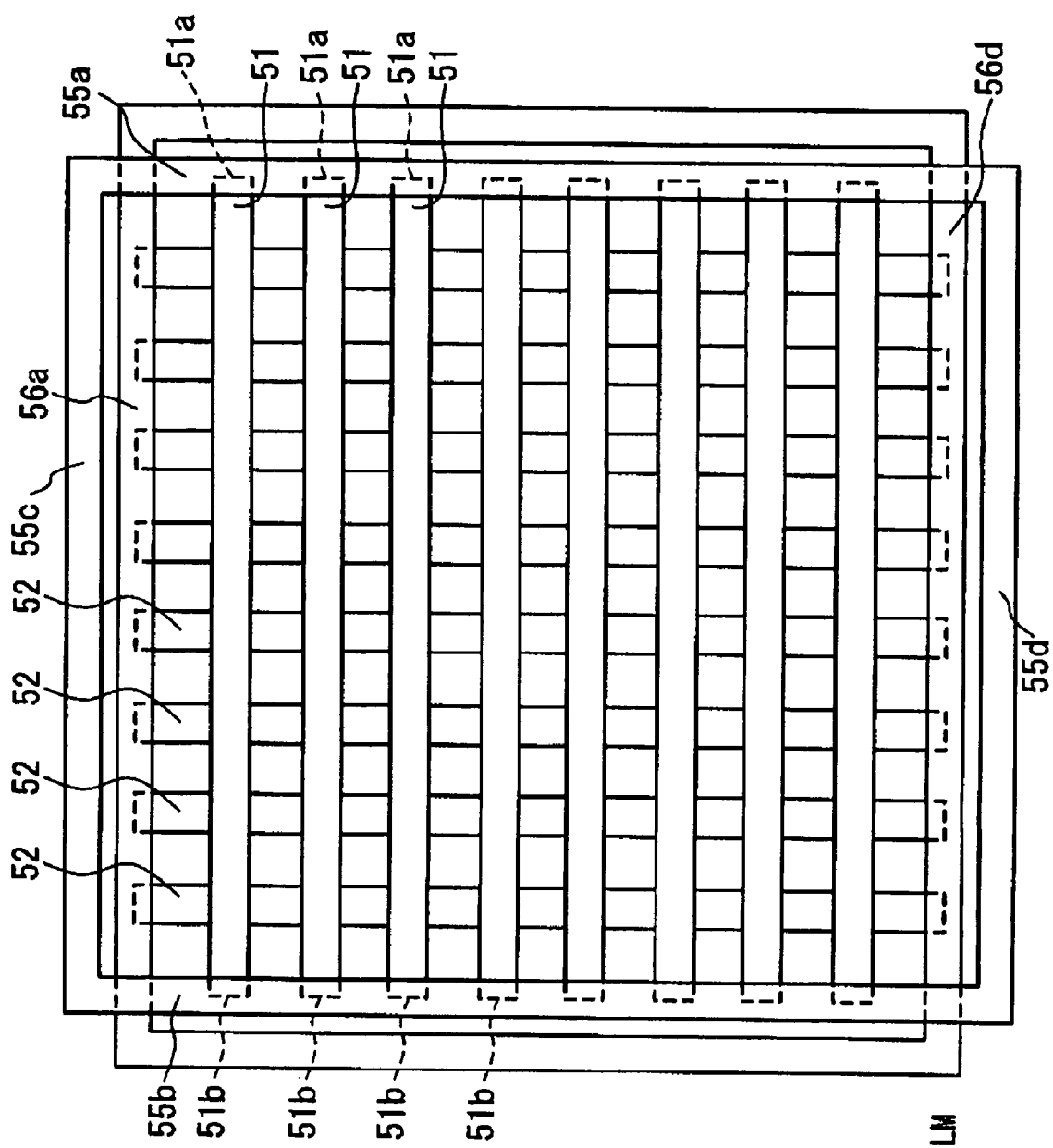
FIG. 29 is a plan view illustrating still another modification of the fourth embodiment of the MRAM according to the present invention.

Furthermore, as shown in FIG. 29, a magnetic film 55a may be formed to overlap the first ends 51a of all the upper write wirings 51, and a magnetic film 55b may be formed to overlap the second ends 51b of all the upper write wirings 51. In this case, the magnetic films 55a and 55b are preferably coupled by a pair of magnetic films 55c and 55d. The magnetic films 55c and 55d are positioned opposed to each other across the array of the upper write wirings 51. Such structure enhances the circulation of the bias magnetic field emitted from the ends of the yoke layers 57 covering the upper write wirings 51, and prevents the bias magnetic field from crossing the magnetoresistance elements, more effectively.

Correspondingly, a magnetic film 56a may be formed to overlap the first ends 52a of all the lower write wirings 52, and a magnetic film 56b may be formed to overlap the second ends 51b of all the lower write wirings 52. In this case, the magnetic films 56a and 56b are preferably coupled by a pair of magnetic films 56c and 56d. The magnetic films 56c and 56d are positioned opposed to each other across the array of the lower write wirings 52. Such structure enhances the circulation of the bias magnetic field emitted from the ends of the yoke layers 60 covering the lower write wirings 52, and prevents the bias magnetic field from crossing the magnetoresistance elements, more effectively.

Fifth Embodiment

Figure 30:
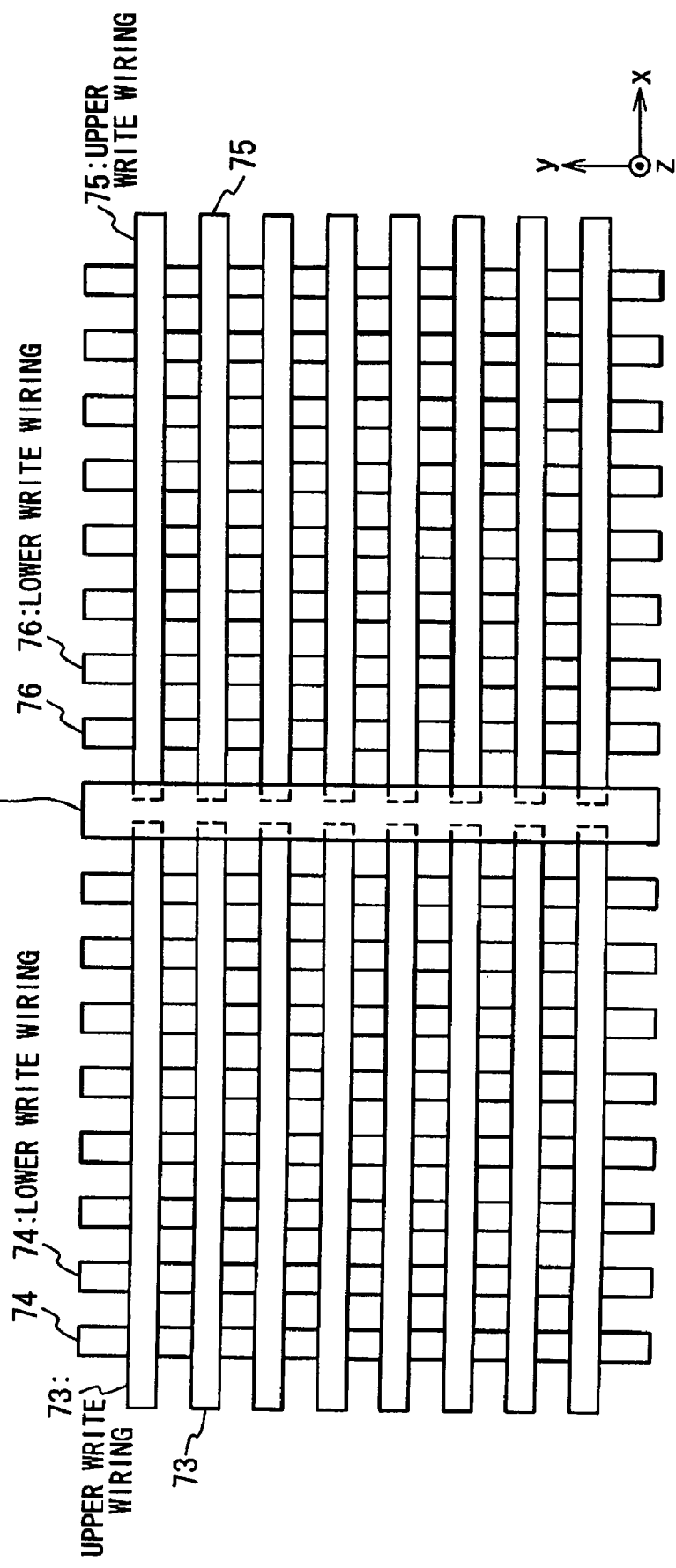
FIG. 30 is a plan view illustrating of an MRAM in a fifth embodiment of the present invention.

FIG. 30 illustrates a fifth embodiment of an MRAM according to the present invention. In the fifth embodiment, two blocks 71 and 72 are disposed to adjoin each other in the x-axis direction. In the block 71, upper write wirings 71 having side and top surfaces covered with yoke layers are disposed to extend in the x-axis direction, and lower write wirings 72 having side and bottom surfaces covered with yoke layers are disposed to extend in the y-axis direction. Magnetoresistance elements are provides at respective intersections of the upper and lower write wirings 73 and 74.

Correspondingly, in the block 72, upper write wirings 75 having side and top surfaces covered with yoke layers are disposed to extend in the x-axis direction, and lower write wirings 76 having side and bottom surfaces covered with yoke layers are disposed to extend in the y-axis direction. Magnetoresistance elements are provides at respective intersections of the upper and lower write wirings 75 and 76.

Figure 31:
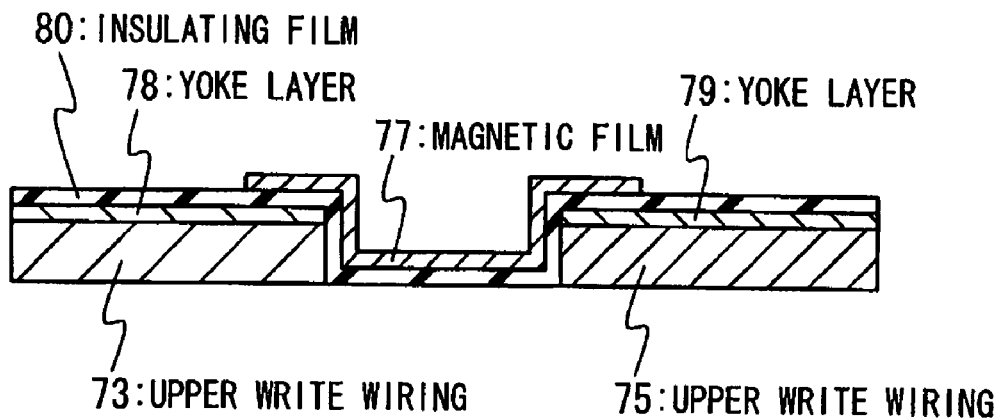
FIG. 31 is a section view illustrating the MRAM in the fifth embodiment.

A conductive magnetic film 77 is provided to overlap the ends of the upper write wirings 73 within the block 71, and the ends of the upper write wirings 74 within the block 72. FIG. 31 illustrates the structure in the vicinity of the ends of the upper write wirings 73 and 75. The upper write wirings 73 and 75 are covered with yoke layers 78 and 79, respectively. The upper write wirings 73 and 75, and the yoke layers 78 and 79 are covered with an insulating film 80. The magnetic film 77 is formed on the insulating film 80. The insulating film 80 provides electrical isolation between the upper write wirings 73 and 75. The magnetic layer 77 is opposed to the yoke layers 78 and 79 across the insulating film 80, and magnetically coupled with the yoke layers 78 and 79.

The magnetic film 77 magnetically couples the yoke layers 78 covering the upper write wirings 73 within the block 71 with the yoke layers 78 covering the upper write wirings 75 within the block 72, and effectively reduces the bias magnetic field applied to the magnetoresistance elements. The magnetic film 77 introduces the bias magnetic field developed by the yoke layers 78 covering the upper write wiring 73 into the yoke layers 79 covering the upper write wiring 75, or introduces the bias magnetic field developed by the yoke layers 79 covering the upper write wiring 75 into the yoke layers 78 covering the upper write wiring 73. Such effect of the magnetic film 77 prevents the magnetic field developed by magnetic poles appearing at the ends of the yoke layers 78 and 79 opposed to the magnetic film 77 from crossing the magnetoresistance elements. Accordingly, the magnetic film 77 effectively reduces the bias magnetic field crossing the magnetoresistance elements.

Let us consider, for example, a case where upper write wirings 73 and 74 having a length of 100 µm, a width of 1 µm, and a thickness of 0.3 µm are covered with yoke layers 78 and 79 having a thickness of 50 nm, and the magnetic film 77 is formed of NiFe having a thickness of 50 nm, separated from the upper write wirings 73 and 74 by an insulating film 80 having a thickness of 20 nm. In this case, substantially the whole of the magnetic field emitted from the ends of the upper write wirings 73 (or the upper write wirings 75) on the side of the magnetic film 77 crosses the magnetic film 77, and no leak of the magnetic field to the magnetoresistance elements is found.

Figure 32:
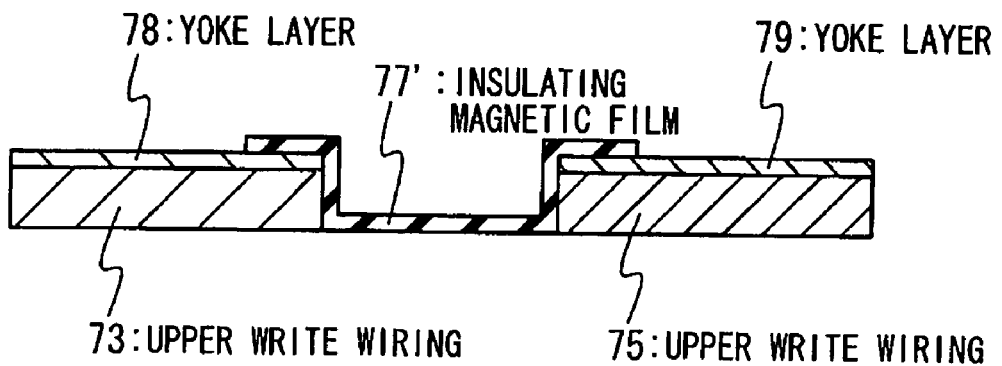
FIG. 32 is a section view illustrating a modification of the MRAM of the fifth embodiment.

As shown in FIG. 32, an insulating magnetic film 77' may be formed in place of the conductive magnetic film 77. In this case, the insulating magnetic film 77' may be formed directly in contact with the yoke layers 78 and 79. The direct contact of the insulating magnetic film 77' enhances the magnetic coupling between the insulating magnetic film 77' and the yoke layers 78 and 79.

Figure 33:
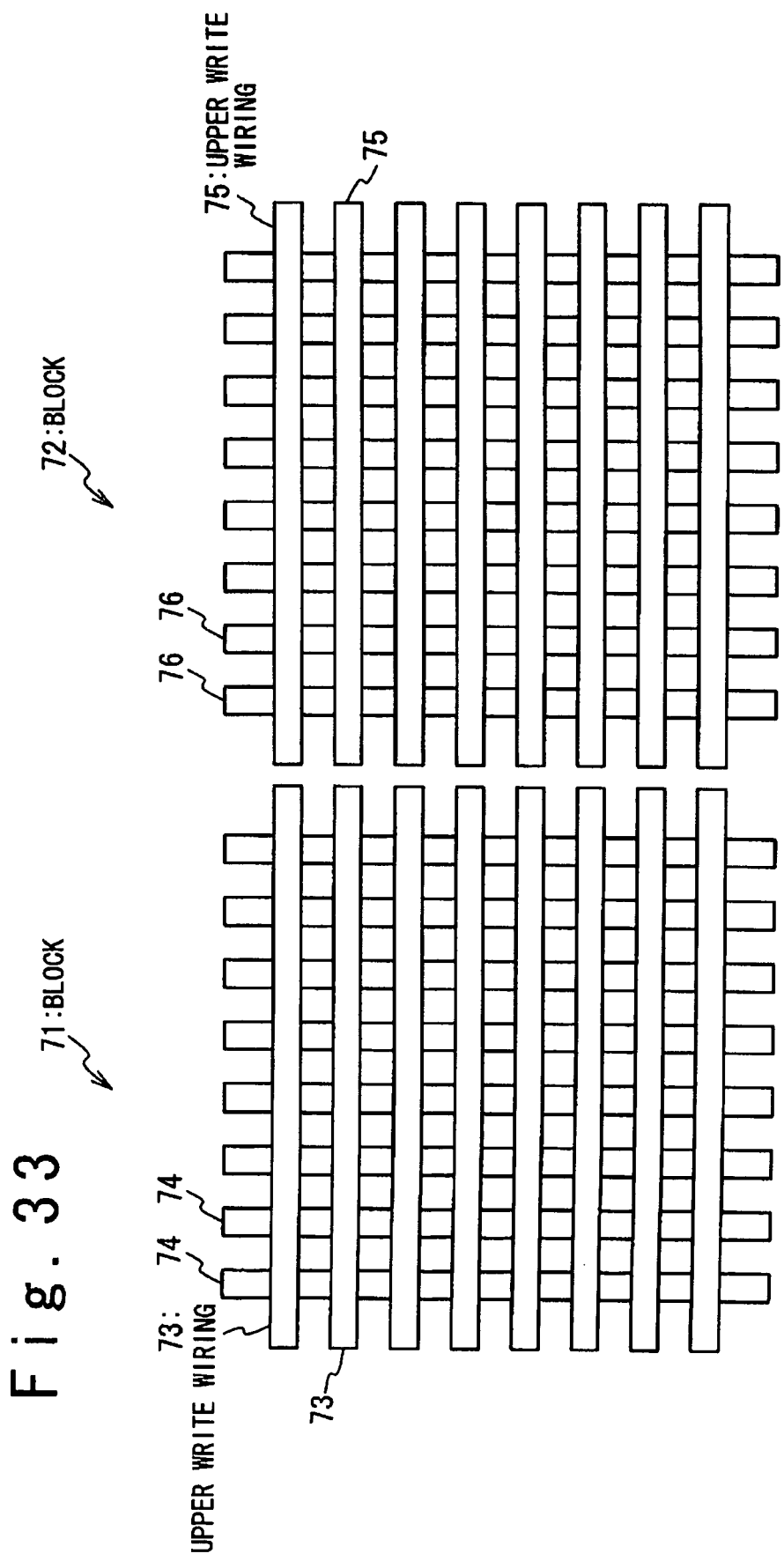
FIG. 33 is a plan view illustrating the modification of the MRAM of the fifth embodiment.
Figure 35A:
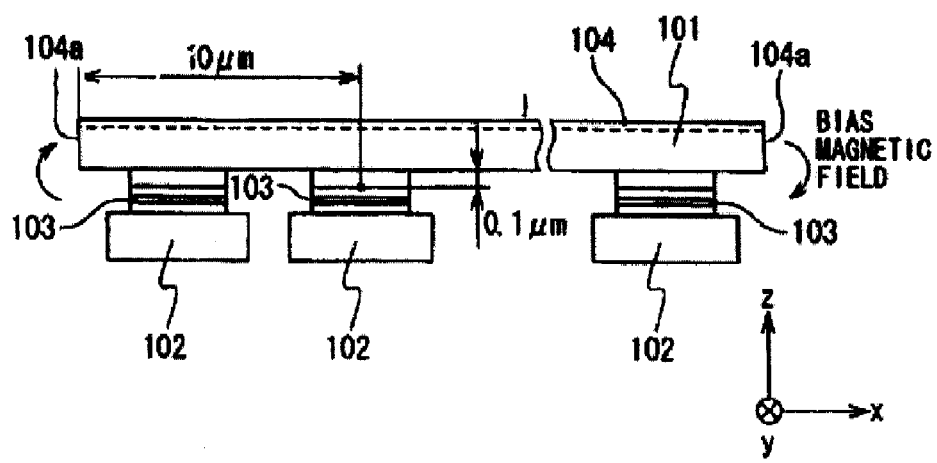
FIG. 35A is a section view illustrating a conventional MRAM.
Figure 35B:
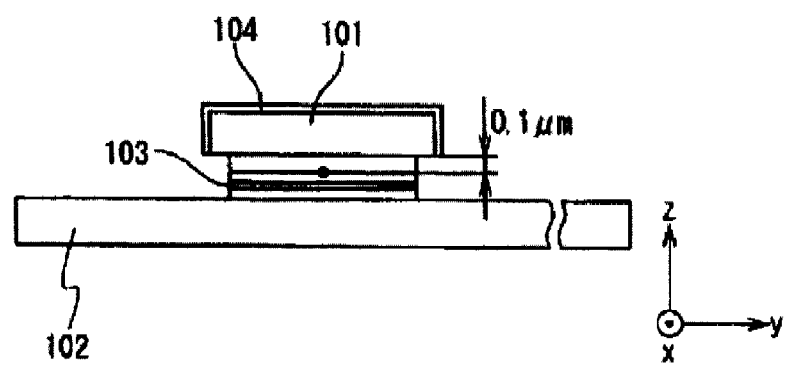
FIG. 35B is a section view illustrating the conventional MRAM.

In this embodiment, as shown in FIG. 33, the upper write wirings 73 within the block 71 and the upper write wirings 75 within the block 72 are disposed sufficiently close to each other, instead of providing the magnetic structure 77. Positioning the upper write wirings 73 and 75 sufficiently close to each other causes the magnetic field developed by the yoke layers 78 covering the upper write wirings 73 to be introduced into the yoke layers 79 covering the upper write wirings 75, or causes the magnetic field developed by the yoke layers 79 covering the upper write wirings 75 to be introduced into the yoke layers 78 covering the upper write wirings 73. Correspondingly to the structure shown in FIG. 30, the structure shown in FIG. 33 effectively reduces the bias magnetic field applied to the magnetoresistance elements.

Sixth Embodiment

FIG. 34 illustrates a sixth embodiment of an MRAM according to the present invention. Upper write wirings 81 having side and top surfaces covered with yoke layers are provided to extend in the x-axis direction, and lower write wirings 82 having side and bottom surfaces covered with yoke layers are provided to extend in the y-axis direction. Magnetoresistance elements 83 are provided at respective intersections of the upper and lower write wirings 81 and 82.

In order to reduce the bias magnetic field applied to the magnetoresistance elements 83, the ends 81a and 82a of the yoke layers covering the upper and lower write wirings 81 and 82 are positioned sufficiently far away so as not to exert effects on the characteristics of the magnetoresistance elements. Since the ends 81a and 82a of the yoke layers covering the upper and lower write wirings 81 and 82 are positioned sufficiently away from the magnetoresistance elements, the distances from the magnetic poles appearing at the ends 81a and 81b of the yoke layers to the magnetoresistance elements are sufficiently increased. The sufficient increase in the distances from the ends 81a and 82a of the yoke layers to the magnetoresistance elements achieves sufficient reduction of the component crossing the magnetoresistance elements out of the magnetic field emitted from the ends of the yoke layers, since the intensity of the static magnetic field emitted by the magnetic pole is inversely proportional to the square of the distance from the magnetic pole. This achieves reduction in the bias magnetic field applied to the magnetoresistance elements down to a degree in which the characteristics of the magnetoresistance elements do not suffer from influences.

Quantitatively, the ends 81a of the yoke layers covering the upper write interconnections 81 are preferably positioned away from the nearest magnetoresistance elements 83, so that the intensity of the bias magnetic field applied by the magnetic poles appearing at the ends 81a to the magnetoresistance elements 83 nearest to the ends 81a is reduced down to one-fifth or less, more preferably, one-tenth or less of the intrinsic coercive field of the free magnetic layers within the magnetoresistance elements 83. It should be noted that the intrinsic coercive field of the free magnetic layers within the magnetoresistance elements 83 means the coercive field in the case where no magnetic field is applied to the free ferromagnetic layers orthogonally to the magnetizations thereof.

Correspondingly, the ends 82a of the yoke layers covering the lower write interconnections 82 are preferably positioned away from the nearest magnetoresistance elements 83, so that the intensity of the bias magnetic field applied by the magnetic poles appearing at the ends 82a to the magnetoresistance elements 83 nearest to the ends 82a is reduced down to one-fifth or less, more preferably, one-tenth or less of the intrinsic coercive field of the free magnetic layers within the magnetoresistance elements 83.

Additionally, the ends 81a of the yoke layers covering the upper write interconnections 81 are preferably positioned away from the nearest magnetoresistance elements 83, so that the distances from the nearest magnetoresistance elements 83 are increased up to or more of the minimum pitch of the lower write wirings 82, more preferably increased up to three times or more of the minimum pitch. Here, the minimum pitch of the lower write wirings 82 means the smallest one of the intervals dx between the centerlines of the lower write wirings 82. When the lower write wirings 82 are arranged in parallel to one another at constant intervals, the minimum pitch is identical to the intervals of the lower write wirings 82.

Correspondingly, the ends 82a of the yoke layers covering the lower write interconnections 82 are preferably positioned away from the nearest magnetoresistance elements 83, so that the distances from the nearest magnetoresistance elements 83 are increased up to or more of the minimum pitch of the upper write wirings 81, more preferably increased up to three times or more of the minimum pitch. Here, the minimum pitch of the upper write wirings 81 means that the smallest one of the intervals dx between the centerlines of the upper write wirings 81. When the upper write wirings 81 are arranged in parallel to one another at constant intervals, the minimum pitch is identical to the intervals of the upper write wirings 81.

As thus described, the bias magnetic field applied to the magnetoresistance elements 83 is reduced by arranging the ends 81a and 82a of the yoke layers sufficiently away from the magnetoresistance elements 83. Let us consider, for example, a case where an upper write wiring 81 having a length of 100 µm, a width of 1 µm, and a thickness of 0.3 µm is covered with a yoke layer formed of NiFe having a thickness of 50 nm. The x-axis component of the magnetic field is about 10 (Oe) at a position where the distance from the end of the upper write wiring 81 is 10 µm in the x-axis direction, and the distance from the bottom surface of the upper write wiring 81 is 0.1 µm. The x-axis component of the magnetic field is about 3 (Oe) at a position where the distance from the end of the upper write wiring 81 is 20 µm in the x-axis direction, and the distance from the bottom surface of the upper write wiring 81 is 0.1 µm. Arranging the end of the upper write wiring 81 at a position 10 µm farther reduces the bias magnetic field applied to the magnetoresistance elements down to about one-third.

The invention claimed is:

1. A magnetic random access memory comprising:
    a magnetoresistance element;
    a first wiring through which a write current flows for writing data into said magnetoresistance element;
    a first yoke layer formed of ferromagnetic material, extended in a first direction, and covering at least portion of a surface of said first wiring;
    a magnetic shielding structure which directs a magnetic field developed by magnetic poles appearing at ends of said first yoke layer in said first direction away from said magnetoresistance element.

2. The magnetic random access memory according to claim 1, wherein said magnetic shielding structure is positioned between said ends of said first yoke layer and said magnetoresistance element.

3. The magnetic random access memory according to claim 2, wherein said magnetic shielding structure obliquely intersects said first wiring.

4. The magnetic random access memory according to claim 3, wherein said magnetic shielding structure has a same stack structure as at least a portion of said magnetoresistance element.

5. The magnetic random access memory according to claim 2, further comprising:
    a second wiring which is not used for writing data into any magnetoresistance elements within said magnetic random access memory, said second wiring being provided to extend in a direction different from said first direction and positioned between said end of said first yoke layer and said magnetoresistance element; and
    a second yoke layer covering at least a portion of a surface of said second wiring,
    wherein said second yoke layer functions as said magnetic shielding structure.

6. The magnetic random access memory according to claim 1, further comprising:
    a spacer layer covering said first yoke layer,
    wherein said magnetic shielding structure includes a magnetic layer covering said spacer layer, and
    wherein said magnetic layer directs a magnetic field emitted from one of said ends of said first yoke layer into another of said ends of said first yoke layer.

7. The magnetic random access memory according to claim 6, wherein magnetizations of said first yoke layer and said magnetic layer are directed in opposite directions.

8. The magnetic random access memory according to claim 7, wherein said spacer layer is formed so as to provide antiferromagnetic coupling between said first yoke layer and said magnetic layer.

9. The magnetic random access memory according to claim 1, further comprising:
   a second interconnection provided to extend in said first direction; and
   a second yoke layer formed of ferromagnetic material, extended in said first direction, and covering at least portion of a surface of said second wiring,
   wherein said magnetic field control structure includes a magnetic member magnetically connecting said first and second yoke layers.

10. The magnetic random access memory according to claim 9, wherein said second wiring is adjacent to said first wiring in a second direction orthogonal to said first direction, and
   wherein said magnetic member includes:
      a first magnetic member magnetically connecting one end of said first yoke layer with one end of said second yoke layer; and
      a second magnetic member magnetically connecting another end of said first yoke layer with another end of said second yoke layer.

11. The magnetic random access memory according to claim 10, further comprising:
   a third magnetic member disposed between said first and second magnetic members;
   a fourth magnetic member positioned on an opposite side of said magnetoresistance element with respect to said third magnetic member, disposed between said first and second magnetic members.

12. The magnetic random access memory according to claim 9, wherein said second wiring is adjacent to said first wiring in said first direction.

13. The magnetic random access memory according to claim 1, further comprising:
   a second wiring provided to extend in said first direction, and adjoining said first wiring in said first direction; and
   a second yoke layer formed of ferromagnetic material, extended in said first direction, and covering at least portion of a surface of said second wiring,
   wherein said second yoke layer functions as said magnetic shielding structure, arranged close to said first yoke layer so that said second yoke layer is magnetically connected with said first yoke layer.

* * * * *